United States Patent [19]

Nakamura et al.

[11] Patent Number: 5,426,603
[45] Date of Patent: Jun. 20, 1995

[54] DYNAMIC RAM AND INFORMATION PROCESSING SYSTEM USING THE SAME

[75] Inventors: Masayuki Nakamura, Akishima; Takayuki Kawahara, Hachiouji; Kazuhiko Kajigaya, Iruma; Kazuyoshi Oshima, Ohme; Tsugio Takahashi, Ohme; Hiroshi Otori, Ohme; Tetsuro Matsumoto, Higashiyamato, all of Japan

[73] Assignee: Hitachi, Ltd., Tokyo, Japan

[21] Appl. No.: 186,460

[22] Filed: Jan. 25, 1994

[30] Foreign Application Priority Data

Jan. 25, 1993 [JP] Japan .................................. 5-028598
Jan. 25, 1993 [JP] Japan .................................. 5-028599

[51] Int. Cl.$^6$ ............................................. G11C 11/24
[52] U.S. Cl. ........................... 365/149; 365/205; 365/203
[58] Field of Search ......................... 365/149, 205, 203

[56] References Cited

PUBLICATIONS

Threshold Difference Compensated Sense Amplifier–IEEE, JSSC vol. SC-14, No. 6, Dec. 1979 pp. 1066–1070.

Primary Examiner—Joseph A. Popek
Assistant Examiner—F. Niranjan
Attorney, Agent, or Firm—Antonelli, Terry, Stout & Kraus

[57] ABSTRACT

A dynamic RAM is provided using a sense amplifier compensating for the disparities of characteristics for paired MOSFET's. With this arrangement parasitic capacitance of the bit lines can be increased to be at least 20 times the capacitance of the memory cells. Each bit line is bisected by a switch MOSFET and is disconnected thereby as needed. A plurality of sets of memory arrays are furnished, each including a switch MOSFET for interconnecting common source lines to which the sense amplifier is connected. This permits recycling of the charges of the common source lines.

14 Claims, 25 Drawing Sheets

DYNAMIC RAM AND INFORMATION PROCESSING SYSTEM USING THE SAME

BACKGROUND OF THE INVENTION

The present invention relates to a dynamic RAM (random access memory) and an information processing system using the same. More particularly, the invention relates to a dynamic RAM capable of mass storage, and an information processing system utilizing such a RAM.

A typical sense amplifier compensating for fluctuating threshold voltages of MOSFET's in a dynamic RAM is disclosed illustratively in Japanese Utility Model Laid-Open No. SHO/56-21897, and another sense amplifier of the same kind is discussed in the minutes 2-288 of the 1983 General Meeting of IECE (Institute of Electronics and Communication Engineers of Japan). The former sense amplifier is one having amplifier MOSFET's connected in a diode formation during the pre-charge period so as to pre-charge the bit lines from the source side. The latter sense amplifier involves separating the sources of amplifier MOSFET's so as to execute initial amplification through capacitive coupling.

In such a dynamic RAM, the sense amplifier is composed of CMOS circuits for reduced power dissipation. Putting the sense amplifier in the CMOS circuit arrangement entails setting the pre-charge potential of the bit lines to half the operating voltage. This means that the CMOS-based sense amplifier cannot be of the type disclosed in Japanese Utility Model Laid-Open No. SHO/56-21897, i.e., the sense amplifier having the bit lines pre-charged with the supply voltage. The fact that the amplifier MOSFET's comprise P- and N-channel MOSFET's poses some problems. One problem is that a one-to-one correspondence cannot be ensured between the offset voltage of the sense amplifier on the one hand, and the fluctuation of the threshold voltage of the N- and P-channel MOSFET's on the other. Another problem is the growing difficulty in performing pre-charging because of the conflict between the N- and the P-channel MOSFET's.

There is a major disadvantage to the sense amplifier discussed in the above minutes of the 1983 General Meeting of IECE. That is, the setup in which the sense amplifier operates on capacitive coupling requires incorporating a huge capacitance into that amplifier. The scheme is not realistic because of the following reason: in a dynamic RAM, a large number of memory cells are connected to each bit line to enlarge the storage capacity. This entails a relatively large parasitic capacitance of the bit lines. To ensure a sufficiently large bit line potential based on capacitive coupling requires furnishing a considerably massive capacitor arrangement. Incorporating such a capacitance arrangement into the sense amplifier is impossible to achieve from the viewpoint of circuit integration.

SUMMARY OF THE INVENTION

In view of the deficiencies of the prior art described, the inventors of the present invention have developed a sense amplifier capable of compensating for the fluctuating threshold voltage of paired MOSFET's while ensuring the sense operation of the memory cells in a mass storage setup. This type of sense amplifier is intended to enhance the degree of circuit integration and to lower power dissipation in dynamic RAMs.

In a dynamic RAM capable of mass storage, what determines its power dissipation is not the memory access operation (read or write) but the refresh operation performed at short intervals to keep the memory cell contents intact. Unlike read or write operations, the refresh operation occurs not randomly but serially. This is the point that inspired the inventors to develop the present invention.

It is therefore an object of the present invention to provide a dynamic RAM offering a large storage capacity while ensuring high circuit integration.

It is another object of the invention to provide a dynamic RAM achieving a large storage capacity and low power dissipation at the same time.

It is a further object of the invention to provide an information processing system that offers high performance while being small in size.

It is an even further object of the invention to provide a semiconductor integrated circuit device having a highly sensitive sense amplifier capable of compensating for the input offset caused by the process disparities of amplifier MOSFET's.

These and other objects, features and advantages of the invention will become more apparent upon a reading of the following description and appended drawings.

Major advantages of the invention disclosed in this specification are as follows: first, there is provided an information processing system utilizing as a memory a dynamic RAM including a sense amplifier in which pairs of MOSFET's are each compensated for disparities in their characteristics and in which the parasitic capacitance of bit lines is at least 20 times the capacitance of the memory cells.

The dynamic RAM may comprise a plurality of pairs of memory arrays, each pair of memory arrays including a switch MOSFET for disconnecting midway each bit line connected to a sense amplifier. The dynamic RAM is addressed so that if a word line intersecting the bit line outside the sense amplifier relative to the switch MOSFET is selected in one of the paired memory arrays, the word line intersecting the bit line on the sense amplifier side relative to the switch MOSFET is selected in the other memory array.

In the dynamic RAM including the above-described sense amplifier, there are provided a plurality of sets of memory arrays, each set of memory arrays including a switch MOSFET for interconnecting common source lines to which the sense amplifier is connected. Word lines are selected consecutively in a given set of memory arrays in refresh mode. The switch MOSFET interconnecting the common source lines is turned on to start activating the sense amplifier. The power switch MOSFET of the sense amplifier is turned on for amplification after the switch MOSFET is turned off.

The dynamic RAM outlined above allows more memory cells to be connected to the bit lines and requires fewer sense amplifiers to be incorporated than was the case in previous DRAMs. This permits higher degrees of circuit integration. Lower power dissipation is achieved because the capacitance of the bit lines is lowered by disconnecting the non-selected word lines, and because the charges of the common source capacitance corresponding to the non-selected sense amplifiers are utilized for initial amplification of the sense amplifiers. This highly integrated power-saving dynamic RAM allows the information processing system utilizing it to provide high performance while remaining small in size.

Furthermore, according to the invention, there are provided a first and a second switch MOSFET between the gate and the input terminal of one of the two conductivity type amplifier MOSFET's constituting a CMOS sense amplifier, and a third and a fourth switch MOSFET between the gate and the common source side of that one amplifier MOSFET. With the first and the second switch MOSFET's turned off and with the third and the fourth switch MOSFET's turned on, the common source side of the amplifier MOSFET is fed with a pre-charge voltage. The pre-charge voltage, used to pre-charge the bit lines, is half the operating voltage plus the threshold voltage of the first and the second MOSFET's. Then with the third and the fourth switch MOSFET's turned off and with the first and the second MOSFET's turned on, the pre-charge voltage is taken as the reference in applying a very low potential to one of the input terminals to activate the amplifier MOSFET for amplification. Thereafter, the other conductivity type amplifier MOSFET that is also part of the CMOS sense amplifier is activated.

The sense amplifier whose initial amplification is effected through capacitive coupling has a switch MOSFET arrangement interposed between the bit lines. During initial amplification based on capacitive coupling, the bit lines are disconnected from the sense amplifier. Once the amplification signal of the sense amplifier has sufficiently developed, the bit lines are again connected to the sense amplifier.

In this manner, the amplifier MOSFET's for starting pre-charging and amplification are limited by operation sequence. Alternatively, the bit lines having a large parasitic capacitance are disconnected from the sense amplifier as needed. This provides for a highly sensitive sense amplifier compensating for the input offset of the amplifier MOSFET's which predominantly effect initial amplification in amplifying very small input signals.

DETAILED DESCRIPTION OF THE PREFERRED EMBODIMENTS

Figure 2:
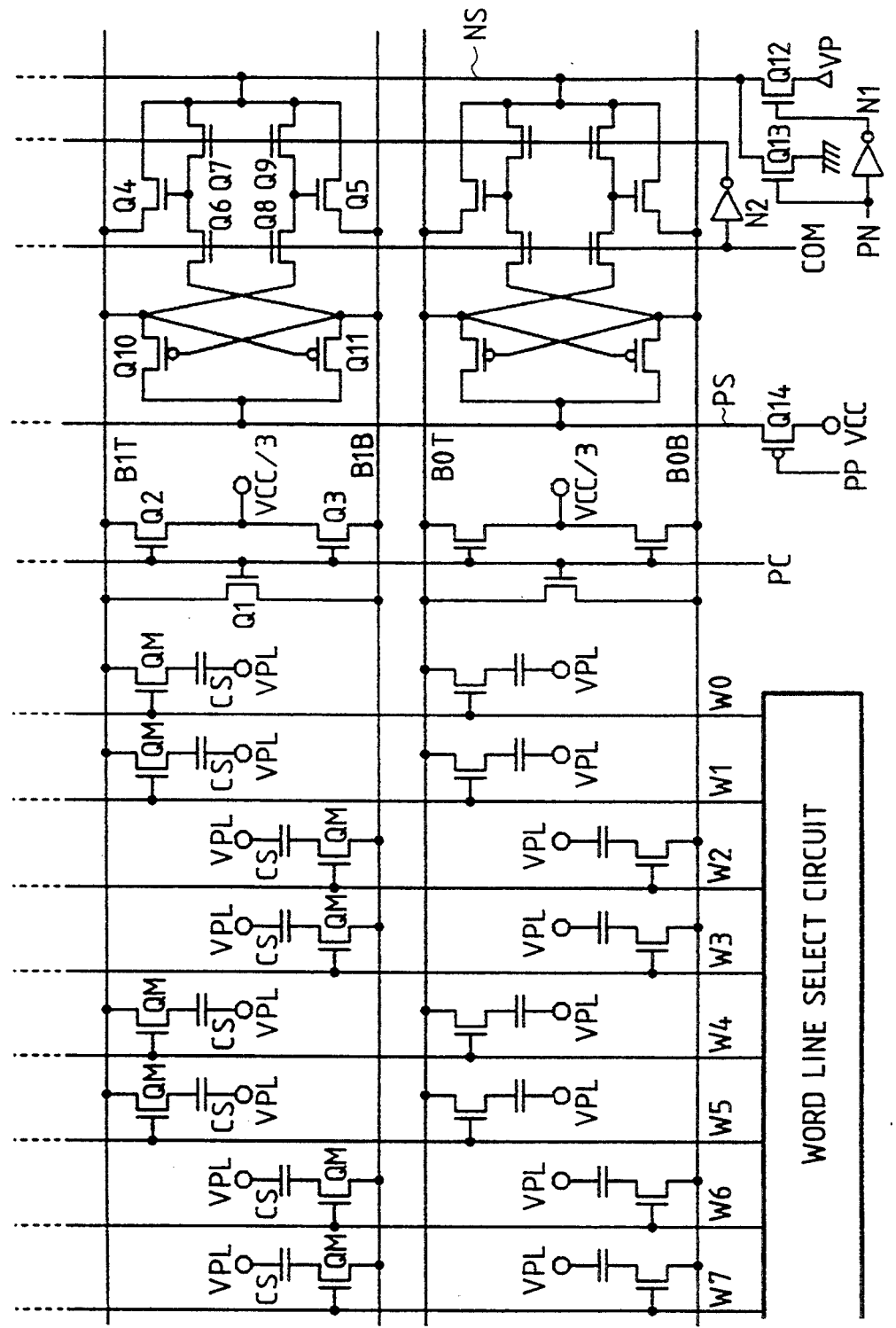
FIG. 2 is a partial circuit diagram of a dynamic RAM embodying the invention.

FIG. 2 is a partial circuit diagram of a dynamic RAM embodying the invention. The circuit elements in FIG. 2 are formed on a single semiconductor substrate such as a single crystal silicon substrate by use of known techniques for manufacturing CMOS (complementary MOS) integrated circuits.

FIG. 2 includes sense amplifiers according to the invention and the related circuits centering on these amplifiers. There are illustratively shown two sense amplifiers, two pairs of bit lines (also called data lines or digit lines), and auxiliary pre-charge circuits and eight word lines, along with memory cells, pre-charge circuits and sense amplifier control circuits furnished at the intersections of the bit lines and word lines. Below is a description of a sense amplifier, an auxiliary pre-charge circuit and other elements associated with one pair of complementary bit lines B1T and B1B.

In the example of FIG. 2, each sense amplifier is basically composed of CMOS transistors. To compensate for the input offset of the CMOS-based sense amplifier requires separating P-channel amplifier MOSFET's Q10 and Q11 from N-channel amplifier MOSFET's Q4 and Q5. These MOSFET's constitute a CMOS sense amplifier. The N-channel amplifier MOSFET's Q4 and Q5 are used in a predominant manner while the P-channel amplifier MOSFET's Q10 and Q11 are used in an auxiliary fashion. That is, at the start of the sense amplifier operation, the N-channel amplifier MOSFET's Q4 and Q5 are first activated to carry out the amplifying operation. Once the amplification signal has developed to a certain degree, the P-channel amplifier MOSFET's Q10 and Q11 are activated so as to obtain a full-swing high-level/low-level output signal corresponding to the small input signal.

With the CMOS sense amplifier operated in the above setup, there occurs a one-to-one correspondence between the actual input offset of the sense amplifier on the one hand, and the disparity (i.e., difference) in threshold voltage between the N-channel amplifier MOSFET's Q4 and Q5 on the other. Where the amplifier MOSFET's of the sense amplifier are separated in their operation as described, the amplifier MOSFET's Q4 and Q5 dominating the amplifying operation have the disparity of their threshold voltages compensated using switch MOSFET's Q6 and Q8 interposed between the gate and the bit lines B1B and B1T of the Q4 and Q5. Switch MOSFET's Q7 and Q9 are furnished between the gate and the common source line NS of the amplifier MOSFET's Q4 and Q5. The switch MOSFET's Q6 through Q9 are composed of, but not limited to, N-channel MOSFET's.

The common source line NS is connected with a source-drain path of a power switch MOSFET Q13 that activates the amplifier MOSFET's Q4 and Q5. The power switch MOSFET Q13 activates the MOSFET's Q4 and Q5 by supplying an activating voltage such as the circuit ground potential to the common source line NS.

Besides activating the amplifier MOSFET's Q4 and Q5, the common source line NS pre-charges the bit lines B1T and B1B. The common source line NS has a pre-charge MOSFET Q12 that supplies a pre-charge voltage VP. The pre-charge voltage VP is set to VCC/2+VTH, where VCC/2 stands for the operating voltage divided by two, and VTH denotes the threshold voltage of the MOSFET's Q4 and Q5.

The switch MOSFET's Q6 and Q8, on the one hand, and the switch MOSFET's Q7 and Q9, on the other hand, are subject to complementary switching control. Specifically, the gates of the switch MOSFET's Q6 and Q8 are fed with a control signal COM, and the gates of the switch MOSFET's Q7 and Q9 are supplied with the control signal COM after inversion by an inverter circuit N2. Likewise, the power switch MOSFET Q13 and the pre-charge MOSFET Q12 are under complementary switching control effected by use of a control signal PN. In other words, the pre-charge MOSFET Q12 is controlled by an inverter circuit N1 that receives the control signal PN.

Meanwhile, the P-channel amplifier MOSFET's Q10 and Q11 activated in an auxiliary fashion take on a latch form, similar to the situation with conventional setups. The common source line PS of the MOSFET's Q10 and Q11 includes a P-channel power switch MOSFET Q14 that supplies the operating voltage such as the supply voltage VCC. A control signal PP that controls the power switch MOSFET Q14 is delayed relative to the control signal PN fed to the gate of the N-channel power switch MOSFET Q13, as will be described later. This arrangement separates in terms of amplification, the P-channel amplifier MOSFET's Q4 and Q5 from the N-channel amplifier MOSFET's Q10 and Q11.

Between the complementary bit lines B1T and B1B is an auxiliary pre-charge circuit composed of a short-circuit MOSFET Q1 and of MOSFET's Q2 and Q3 for supplying an auxiliary pre-charge voltage VCC/3. The workings of the auxiliary pre-charge circuit are basically the same as those of conventional half-pre-charge circuits. The difference from conventional circuit operation is that the voltage level of the auxiliary pre-charge circuit is lowered from the half-pre-charge voltage VCC/2 provided by the short-circuit MOSFET Q1 down to the voltage VCC/3 by the MOSFET's Q2 and Q3 becoming turned on.

A memory cell is provided at the intersection between a word line and one of the bit lines B1T and B1B. For each of address selecting MOSFET's QM, the gate is connected to the word line and one end of the source-drain path is connected to the bit line B1T or B1B. Between the other end of the source-drain path and a plate voltage VPL is a capacitor CS for information storage. This memory arrangement is the same as that of conventional dynamic RAM's and will not be discussed further. A word line selecting circuit selects one of the word lines which is to be connected.

Other complementary bit lines B0T and B0B and their associated auxiliary pre-charge circuit and sense amplifier in FIG. 2 are the same as their counterparts described above. As such, these parts are not given any reference characters in FIG. 2 and will not be described further. The sense amplifier control circuit and the pre-charge circuit are shared by the sense amplifier connected to the bit lines B1T and B1B.

Figure 1:
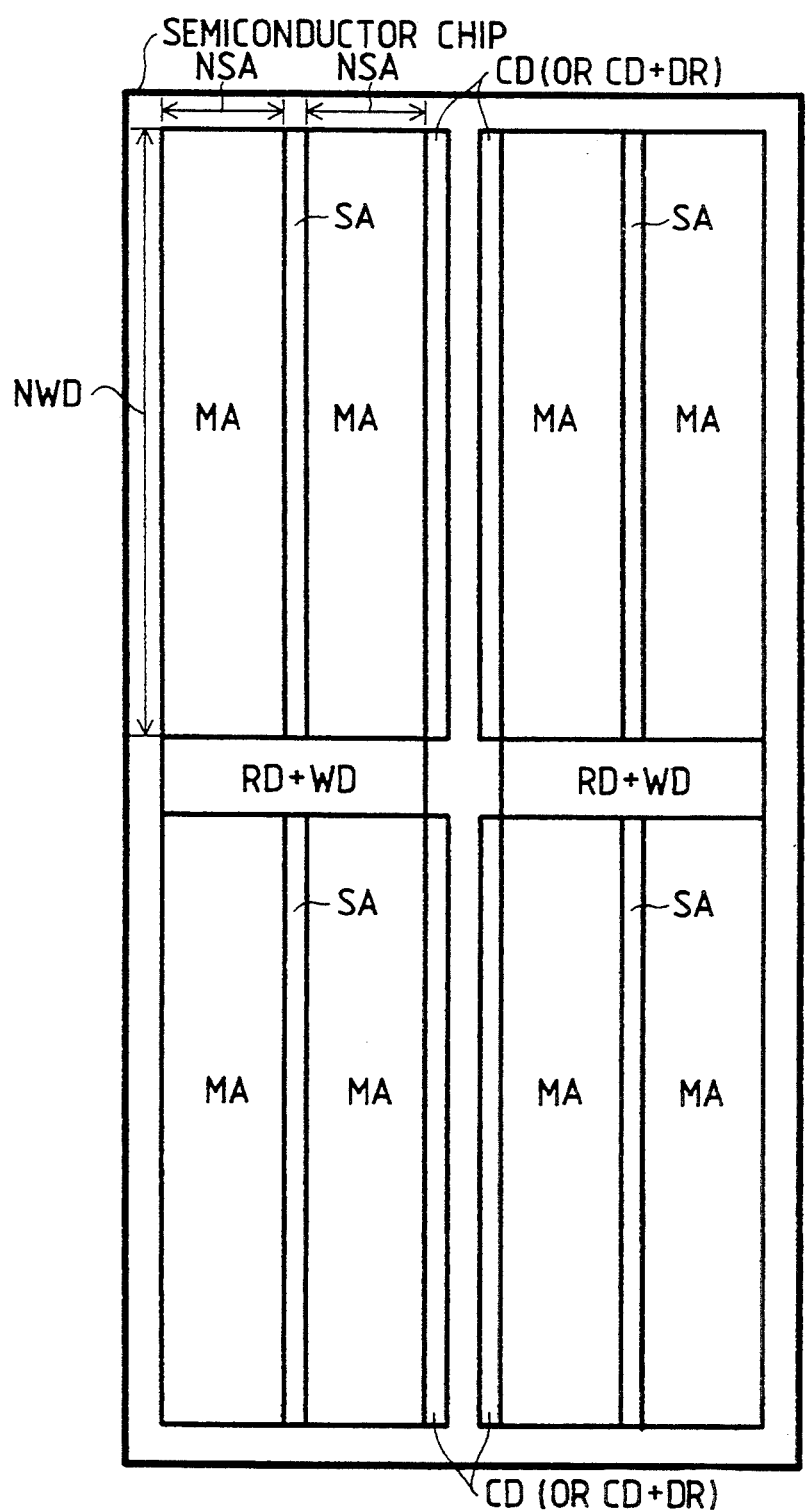
FIG. 1 is a chip layout view of a dynamic RAM using sense amplifiers according to the invention.
Figure 4:
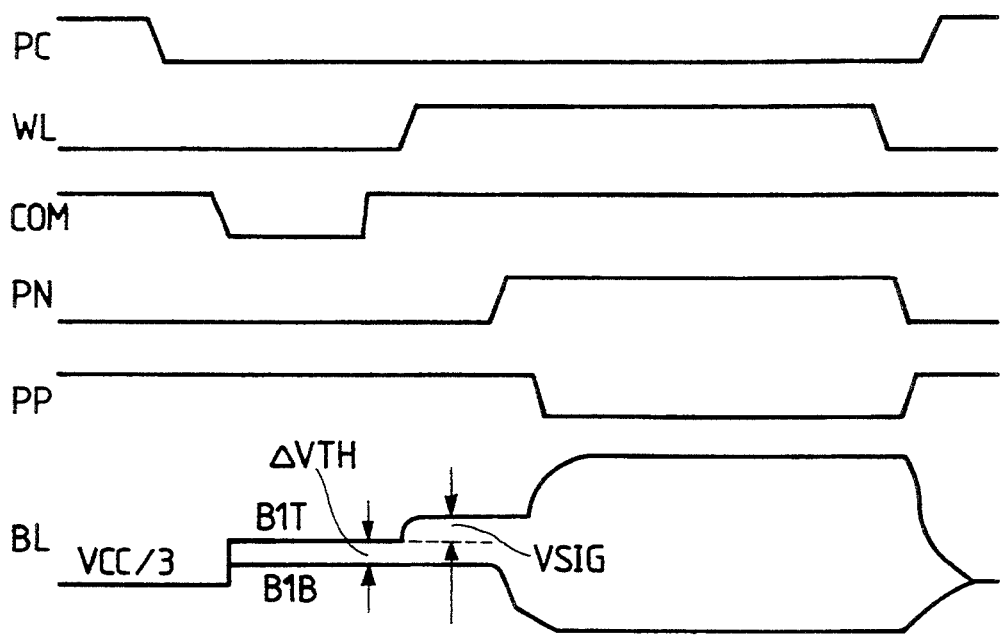
FIG. 4 is a timing chart of the sense amplifier included in FIG. 1.

FIG. 4 is a timing chart of the sense amplifier included in FIG. 1, showing how the sense amplifier illustratively operates. An auxiliary pre-charge operation is carried out when a signal PC is on the high level. That is, bringing the control signal PC High turns on the MOSFET's Q1, Q2 and Q3 and supplies the complementary bit lines BL with the auxiliary pre-charge voltage such as VCC/3.

With the signal PC brought Low to turn off the MOSFET's Q1 through Q3, the complementary bit lines BL are placed in the high impedance state. Once in their high impedance state, the complementary bit lines BL (B1T, B1B) maintain the voltage VCC/3.

Bringing the control signal COM Low turns off the switch MOSFET's Q6 and Q8 and turns on the switch MOSFET's Q7 and Q9. This causes the gates and the common source side of the N-channel amplifier MOSFET's Q4 and Q5 to be short-circuited, which puts these MOSFET's in diode formation. As a result, the pre-charge voltage VP fed from the common source line NS is forwarded to the bit lines B1T and B1B via the amplifier MOSFET's Q4 and Q5 in diode formation. At this point, if the threshold voltage of the amplifier MOSFET Q5 is greater than that of the amplifier MOSFET Q4 by ΔVTH, a level difference equivalent to the threshold voltage difference ΔVTH develops between the bit lines B1T and B1B.

With the bit lines B1T and B1B pre-charged using VCC/3 as described, the voltage level of these bit lines, in spite of their relatively large parasitic capacitance CB, is changed rapidly to the pre-charge level substantially corresponding to VCC/2 via the amplifier MOSFET's Q4 and Q5. This is because the level difference is sufficiently small. The pre-charge voltage VP on the common source line NS is used to supplement the voltage VCC/2 by compensating for a level drop of the threshold voltage VTH of the MOSFET's Q4 and Q5. This causes the pre-charge voltage of the bit lines B1T and B1B to become substantially the half-pre-charge voltage VCC/2, as described.

The control signal COM is then brought back to the high level, the MOSFET's Q7 and Q9 are turned off, the MOSFET's Q6 and Q8 are turned on, the amplifier MOSFET's Q4 and Q8 are latched, and the word line WL is selected. This causes the bit line to which the memory cell is connected to develop a very small change in potential due to the dispersion of charges into two portions: the charges in the capacitor CS of the memory, and the pre-charges of the parasitic capacitance CB on the bit line. That potential change is sent to the gates of the amplifier MOSFET's Q4 and Q5 of the sense amplifier as a very small read signal VSIG from the memory cell representing the potential difference.

In the example of FIG. 2, the above-described pre-charge operation supplies the bit lines beforehand with the offset voltage ΔVTH corresponding to the threshold voltage of the amplifier MOSFET's Q4 and Q5. As a result, the very small read signal VSIG is fed unchanged to the amplifier MOSFET's as a gate voltage difference. In this state, the control signal PN is brought High to activate the amplifier MOSFET's Q4 and Q5. In turn, the N-channel amplifier MOSFET's Q4 and Q5 alone start amplifying the very small read signal VSIG.

The amplifying operation of the N-channel amplifier MOSFET's Q4 and Q5 brings the control signal PP Low only after the amplification signal has developed to a certain degree. In turn, the P-channel amplifier MOSFET's Q10 and Q11 are activated for amplification along with the N-channel amplifier MOSFET's Q4 and Q5. This gives the bit line potential a full swing characteristic spanning two extreme levels: as high as VCC and as low as 0 V.

The P-channel amplifier MOSFET's Q10 and Q11 also have an offset voltage corresponding to the threshold voltage. However, at the start of the amplifying operation, these MOSFET's develop an input voltage difference large enough to let the offset voltage be ignored. For this reason, the effects of the offset voltage are practically eliminated. That is, the P-channel amplifier MOSFET's Q10 and Q11 play a supplementary role in amplification by preventing the drop in the bit line potential that should be brought High by operation of the N-channel amplifier MOSFET's Q4 and Q5, and by pulling up the potential to the level of the supply voltage VCC.

After access to the memory is completed, the word line WL is reset, and the control signals PN and PP for activating the sense amplifier are reset, the control signal PC is brought High. This turns on the MOSFET's Q1 through Q3. With the MOSFET Q1 on, the complementary bit lines B1T and B1B are short-circuited between the high and low levels. This should result in the voltage VCC/2, except that the MOSFET's Q2 and Q3 are also turned on to bring about the auxiliary pre-charge voltage VCC/3 that is slightly lower than the voltage VCC/2.

Figure 3:
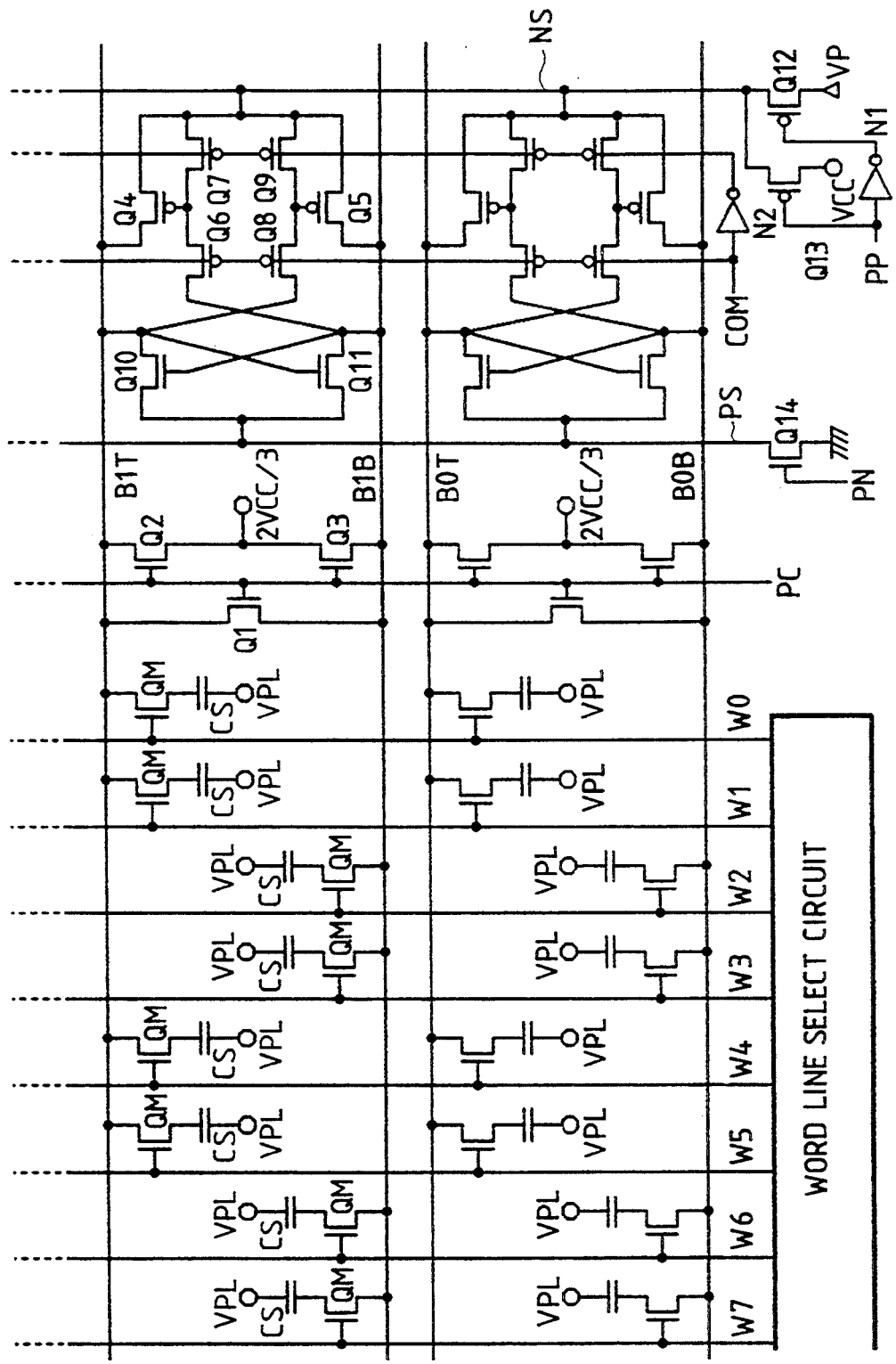
FIG. 3 is a partial circuit diagram of another dynamic RAM embodying the invention.

FIG. 3 is a partial circuit diagram of another dynamic RAM embodying the invention. In this example, the P-channel amplifier MOSFET's play the dominant role in the CMOS sense amplifier while the N-channel amplifier MOSFET's operate in an auxiliary fashion. That is, switching the places of the P- and N-channel MOSFET's in the sense amplifier of FIG. 2 provides the setup of FIG. 3. Thus, the reference characters representing the circuits in FIG. 2 remain unchanged for the setup in FIG. 3; only the P-channel MOSFET's and the N-channel MOSFET's switch their places.

When the P-channel amplifier MOSFET's Q4 and Q5 are used in dominant fashion, the pre-charge voltage VP is made lower (e.g., VCC/2−VTH). By contrast, the auxiliary pre-charge voltage on the bit lines becomes higher (e.g., 2VCC/3). The reason is that the operating voltage will be on the side of 0 V when the P-channel amplifier MOSFET's are allowed to work predominantly, and that the voltage levels involved need to be inverted correspondingly.

In the circuit diagrams of FIGS. 2 and 3, the P- and N-channel power switch MOSFET's are shown located on one side of the sense amplifier column. In the actual layout, one power switch MOSFET comes above the sense amplifier column and the other below it.

Figure 5:
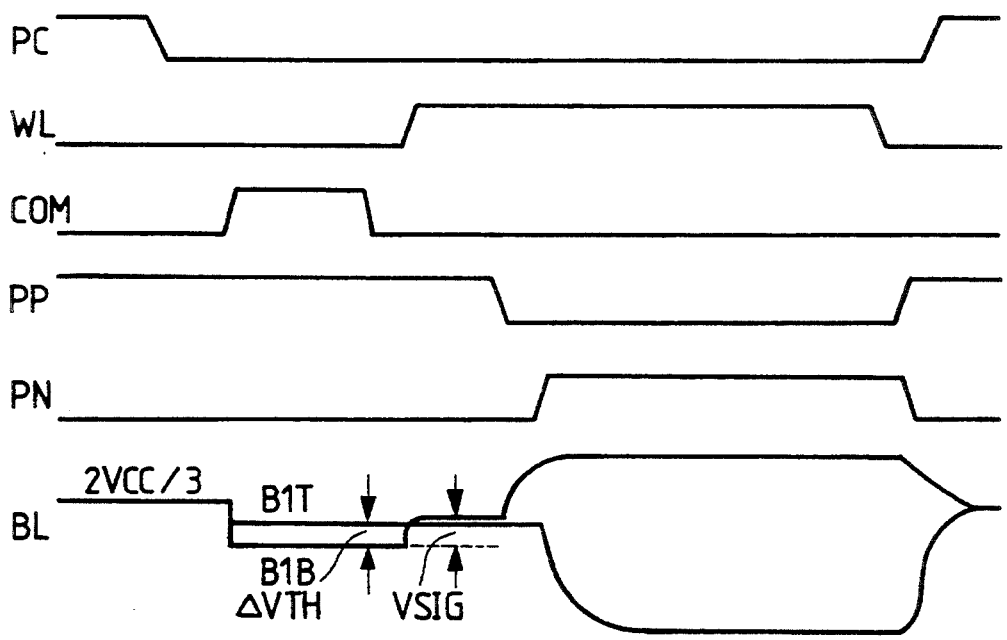
FIG. 5 is a timing chart of the sense amplifier included in FIG. 3.

FIG. 5 is a timing chart of the sense amplifier included in FIG. 3, showing how it operates. The operation is are basically the same as that depicted in FIG. 4, except that different pre-charge voltages are set with respect to the operating voltage.

The very small read signal VSIG from the memory cell apparently disappears on the bit lines B1T and B1B when the signal is on the level reverse to that of the offset voltage ΔVth. However, the very small read signal VSIG indicated by broken line in FIG. 5 is applied between the gates of the amplifiers MOSFET's Q4 and Q5. This amplifies the bit lines B1T and B1B to the high and low levels correspondingly.

Figure 6:
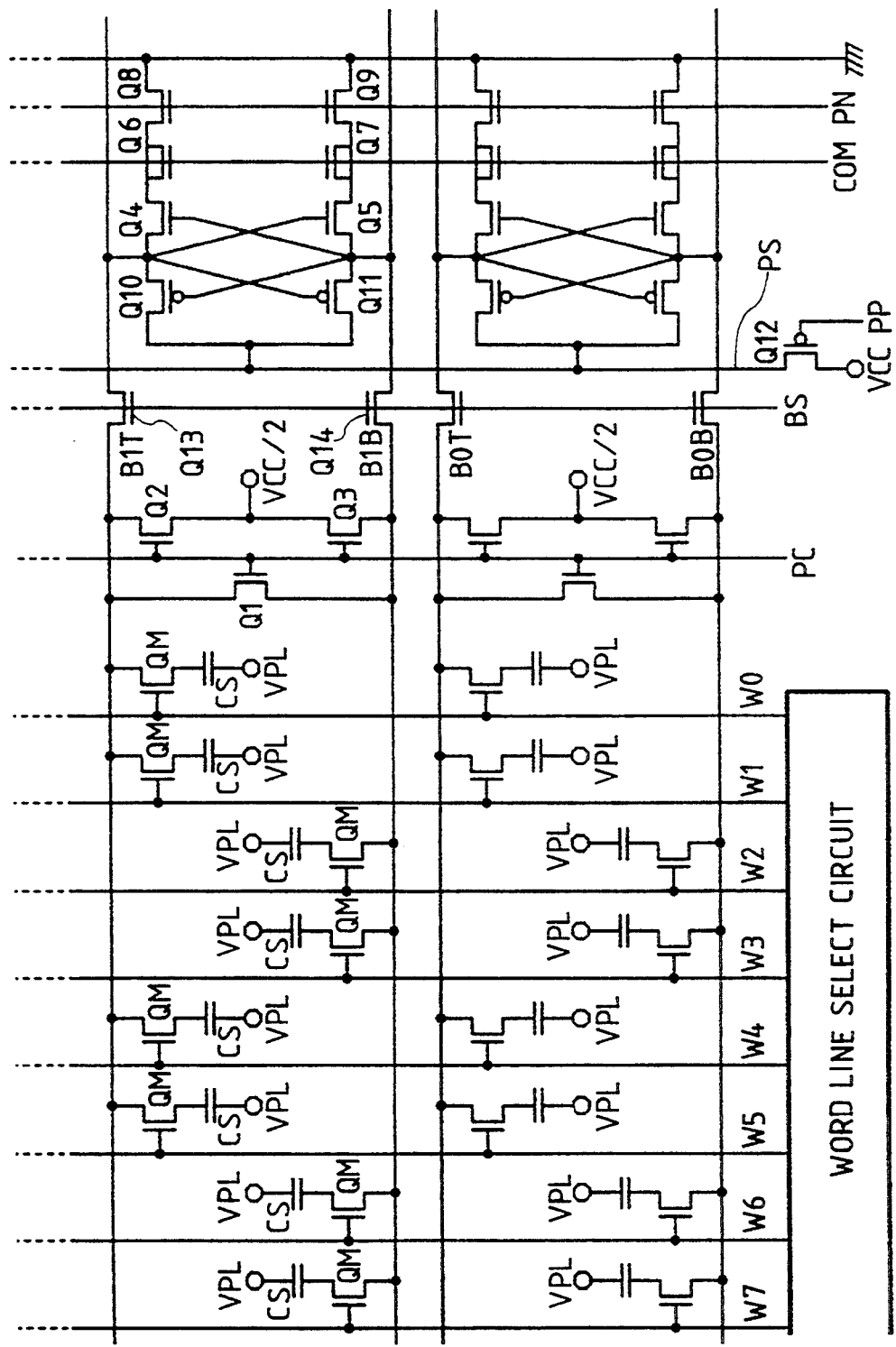
FIG. 6 is a partial circuit diagram of another dynamic RAM embodying the invention.

FIG. 6 is a partial circuit diagram of another dynamic RAM embodying the invention. Although similar reference characters are used in FIG. 6 as well as in FIGS. 2 and 3, they designate parts of basically different circuit functions. The same holds for the other circuit diagrams.

In the example of FIG. 6, the N-channel amplifier MOSFET's play the dominant role in the CMOS sense amplifier while the P-channel amplifier MOSFET's operate in an auxiliary fashion. Thus, the difference in threshold voltage between the N-channel amplifier MOSFET's Q4 and Q5 corresponds substantially to the input offset of the sense amplifier. The input offset is compensated using capacitive coupling.

The amplifier MOSFET's Q4 and Q5, which have their gates and drains connected in an intersecting manner, also have their sources furnished with capacitors shown in the form of MOS capacitances. The drains and sources of the MOSFET's Q6 and Q7 are connected to form one capacitor electrode which in turn is connected to the sources of the amplifier MOSFET's Q4 and Q5. The gates of the MOSFET's Q6 and Q7 acting as capacitors form the other capacitor electrode which is fed with the control signal COM.

The sources of the amplifier MOSFET's Q4 and Q5 are furnished with the MOSFET's Q8 and Q9 working as power switches. The MOSFET's Q8 and Q9 also act to separate the source of the amplifier MOSFET Q4 from that of the amplifier MOSFET Q5.

The P-channel amplifier MOSFET's Q10 and Q11 activated in an auxiliary fashion constitute a latch. Unlike the N-channel amplifier MOSFET's Q4 and Q5, the P-channel MOSFET's Q10 and Q11 have their sources connected to the common source line PS. The common source line PS is provided with the P-channel power switch MOSFET Q12 that supplies the operating voltage such as the supply voltage VCC. The control signal PP that controls the power switch MOSFET Q12 is delayed relative to the control signal PN fed to the N-channel power switch MOSFET's Q8 and Q9, as will be described later. This arrangement separates the P-channel amplifier MOSFET's Q4 and Q5 from the N-channel amplifier MOSFET's Q10 and Q11 in terms of amplification.

The input and output nodes of the above-described sense amplifier are connected to the complementary bit lies B1T and B1B via the switch MOSFET's Q13 and Q14. The gates of the switch MOSFET's Q13 and Q14 are supplied with a control signal BS.

The complementary bit lines B1T and B1B are furnished with a pre-charge circuit composed of the MOSFET's Q1 through Q3. This pre-charge circuit has the same circuit structure as the auxiliary pre-charge circuits shown in FIGS. 2 and 3, except that this pre-charge circuit brings about the half-pre-charge voltage such as VCC/2. The memory cells, word lines, word line selecting circuit and other elements are the same in constitution as those in FIGS. 2 and 3 and will not be described further.

Figure 8:
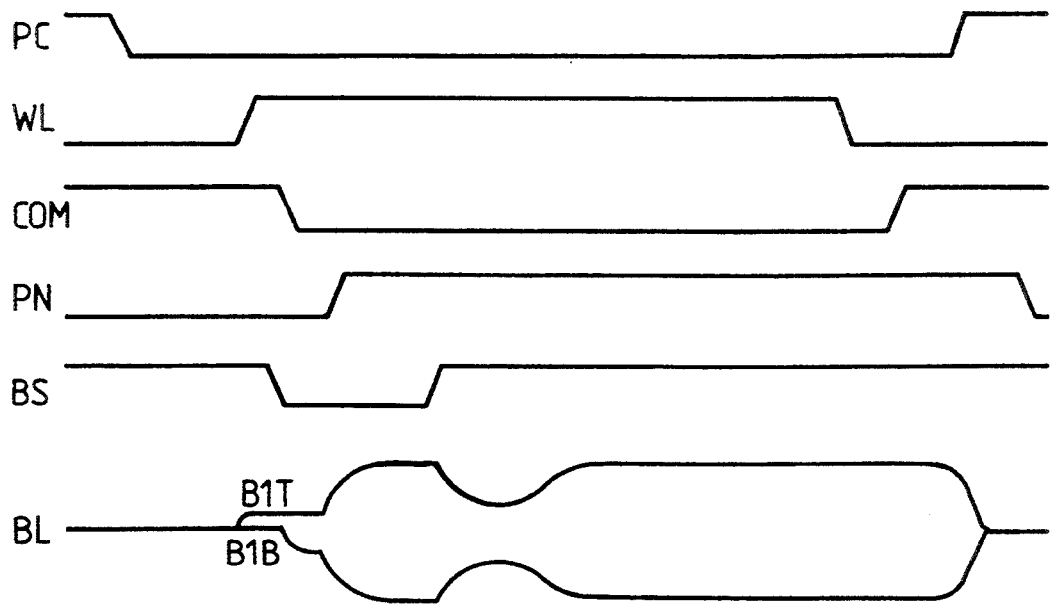
FIG. 8 is a timing chart of the sense amplifier included in FIG. 6.

FIG. 8 is a timing chart of the sense amplifier included in FIG. 6, depicting how it operates. A pre-charge operation is performed when the signal PC is on the high level. That is, bringing the control signal PC High turns on the MOSFET's Q1, Q2 and Q3 so as to supply the complementary bit lines B1T and B1B with the pre-charge voltage such as VCC/2. The voltage VCC/2 is fed to the gates and drains of the amplifier MOSFET's Q4 and Q5 so that the source potential of the two transistors is lowered by the amount of the threshold voltage VTH. The resulting potential is accumulated in the MOS capacitor formed by the MOSFET's Q6 and Q7.

The signal PC is then brought Low to turn off the MOSFET's Q1 through Q3. This places the complementary bit lines B1T and B1B in the high impedance state. While in their high impedance state, the complementary bit lines BL (B1T, B1B) hold the voltage VCC/2. Between the gates and sources of the amplifier MOSFET's Q4 and Q5, voltages corresponding to the threshold voltages VTH of the respective transistors fare maintained.

When the word line WL is selected, the bit lines to which the memory cell is connected develop a very small potential change caused by the charge dispersion attributable to two kinds of charges: charges accumulated in the memory cell capacitor CS, and pre-charges of the parasitic capacitance CB on the bit lines. In the, sense amplifier, that potential change representing a potential difference is sent to the gates of the amplifier MOSFET's Q4 and Q5 as a very small read signal from the memory cell.

As described, between the gates and sources of the amplifier MOSFET's a bias voltage develops corresponding to the threshold voltages of the respective transistors. That bias voltage is caused by the bit line potential and the holding voltages of the MOSFET's Q6 and Q7 acting as the capacitor. Thus the potential difference between the bit lines B1T and B1B is supplied as the difference in voltage between the gates of the amplifier MOSFET's Q4 and Q5 irrespective of the above-described threshold voltage difference.

When the voltage difference caused by the read signal is fed to the gates of the amplifier MOSFET's Q4 and Q5, the control signal BS is brought Low to turn off the switch MOSFET's Q13 and Q14. This disconnects the sense amplifier from the bit lines B1T and B1B having the large parasitic capacitance CB.

Bringing the control signal COM Low activates the amplifier MOSFET's Q4 and Q5. The capacitive coupling based on the gate capacitance of the capacitors Q6 and Q7 lowers the source potentials of the MOSFET's Q4 and Q5 while leaving intact the voltage difference corresponding to the difference in threshold voltage. At this point, the sense amplifier is disconnected from the bit lines B1T and B1B. This makes it possible to lower the parasitic capacitance on the input side approximately down to the gate capacitance of the MOSFET's Q6 and Q7. Accordingly, the above-mentioned capacitive coupling allows the amplifier MOSFET's Q4 and Q5 to boost the potential difference across one pair of input terminals.

Thereafter, the signal PN is brought High to turn on the N-channel power switch MOSFET's Q8 and Q9 for full-blown amplification. At the same time, the signal PP is brought Low (not shown) to turn on the P-channel power switch MOSFET Q12, which in turn activates the P-channel amplifier MOSFET's Q10 and Q11.

The P-channel amplifier MOSFET's Q10 and Q11 have also an offset voltage corresponding to the threshold voltage. When these transistors start their amplifying operation, however, the input voltage difference becomes large enough to let the offset voltage be ignored. This effectively eliminates the adverse effects of the offset voltage. That is, the P-channel amplifier MOSFET's Q10 and Q11 not only prevent drops in the potential of the bit lines that should be brought High by amplification of the capacitive coupling effected by the N-channel amplifier MOSFET's Q4 and Q5, but also pull the bit line potential up to the supply voltage VCC. In this way, the P-channel amplifier MOSFET's Q10 and Q11 provide amplification in an auxiliary fashion.

Following activation of the power switch MOSFET arrangement described above, the signal BS is brought High to turn on the switch MOSFET's Q13 and Q14. This connects the sense amplifier to the bit lines B1T and B1B having the large parasitic capacitance. The bit line potential temporarily becomes smaller, and is then expanded by amplification to span a range as high as the supply voltage VCC and as low as the circuit ground potential.

After access to the memory is terminated, the word line WL is reset, and the control signals PN and PP for activating the sense amplifier are reset, the control signal PC is brought High. This turns on the MOSFET's Q1 through Q3. With the MOSFET Q1 turned on, the complementary bit lines B1T and B1B are short-circuited between the high and low levels to bring about the pre-charge voltage such as VCC/2.

Figure 7:
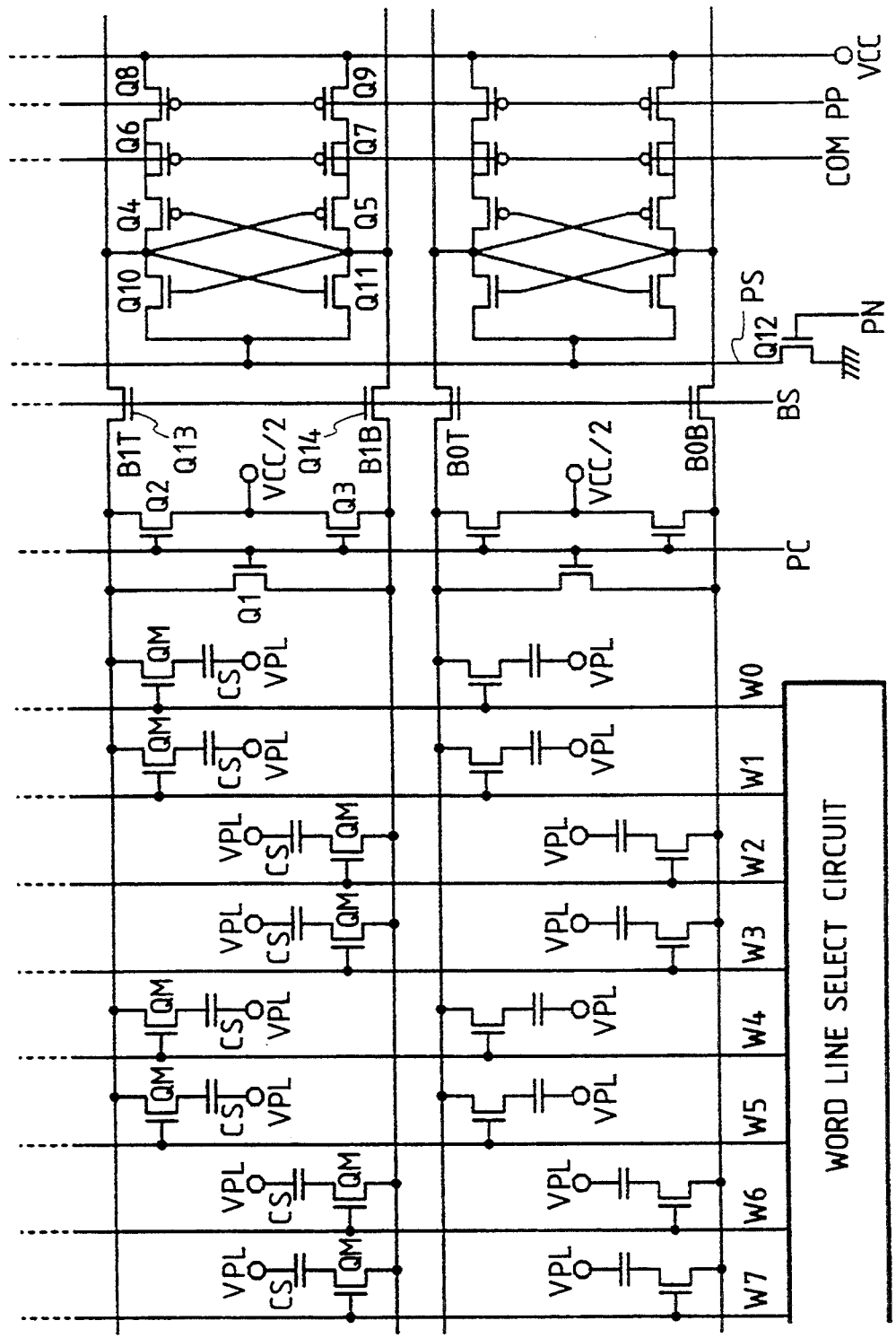
FIG. 7 is a partial circuit diagram of another dynamic RAM embodying the invention.

FIG. 7 is a partial circuit diagram of another dynamic RAM embodying the invention. In the example of FIG. 7, the P-channel amplifier MOSFET's play the dominant role in the CMOS sense amplifier while the N-channel amplifier MOSFET's operate in an auxiliary fashion. That is, switching the places of the P- and N-channel MOSFET's in the sense amplifier of FIG. 6 provides the setup of FIG. 7. Thus, the reference characters representing the circuits in FIG. 6 remain unchanged for the setup in FIG. 7; only the P-channel MOSFET's and the N-channel MOSFET's switch places.

Figure 9:
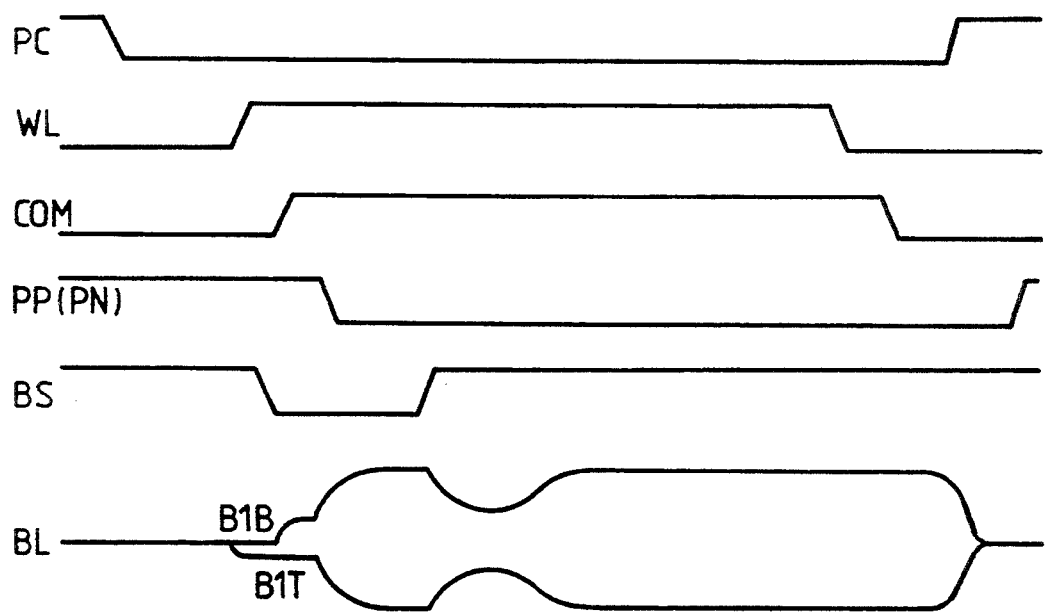
FIG. 9 is a timing chart of the sense amplifier included in FIG. 7.

FIG. 9 is a timing chart of the sense amplifier included in FIG. 7, illustrating how it functions. The operation is basically the same as that depicted in FIG. 8, except that the signal COM in FIG. 9 is brought High with respect to the operating voltage VCC of the P-channel amplifier MOSFET's, as opposed to the signal COM in FIG. 8 being brought Low. The rest of the constitution is the same as that of the preceding example and will not be described further.

Figure 31:
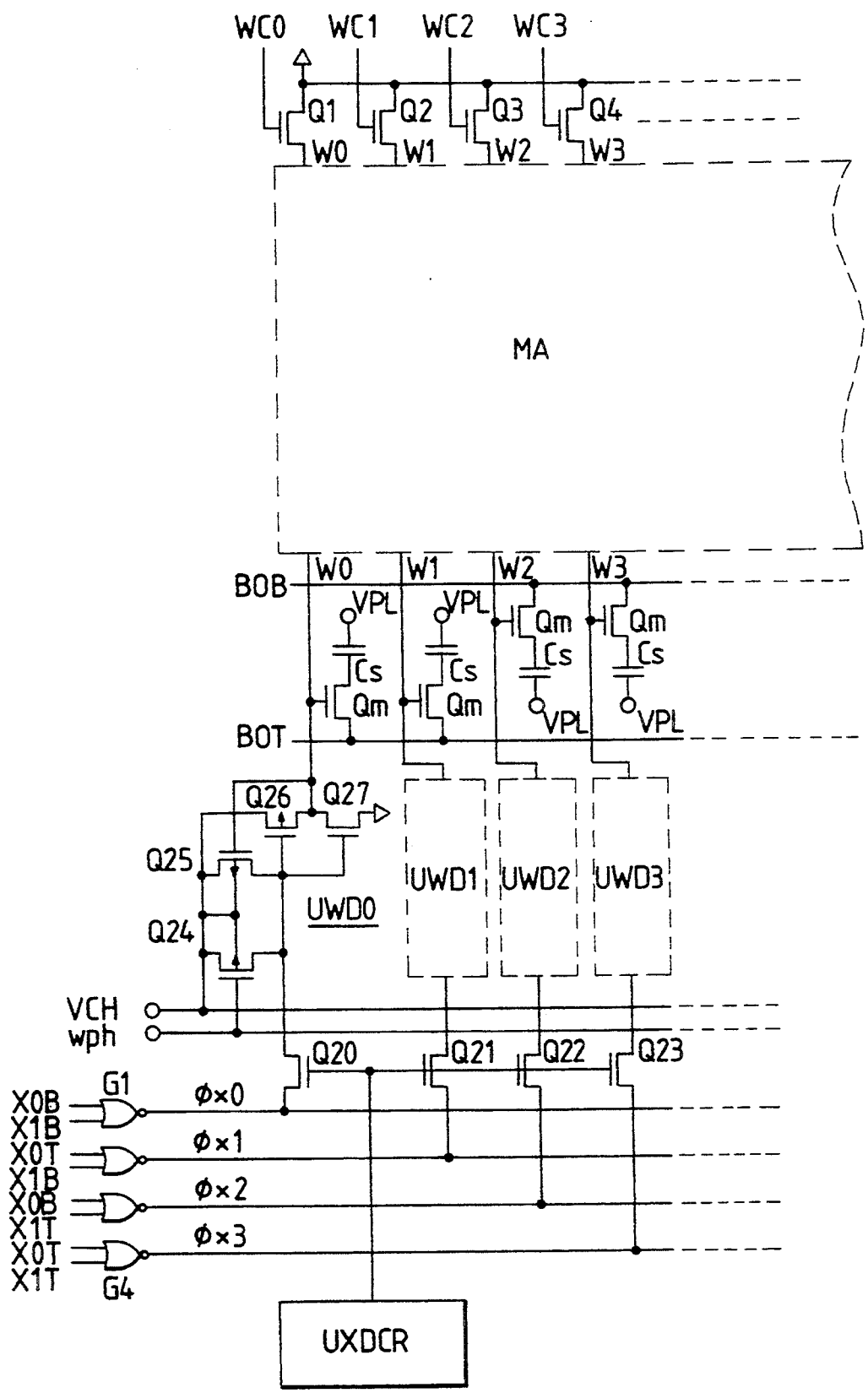
FIG. 31 is a circuit diagram of memory arrays and a row selecting circuit in a dynamic RAM according to the invention.
Figure 32:
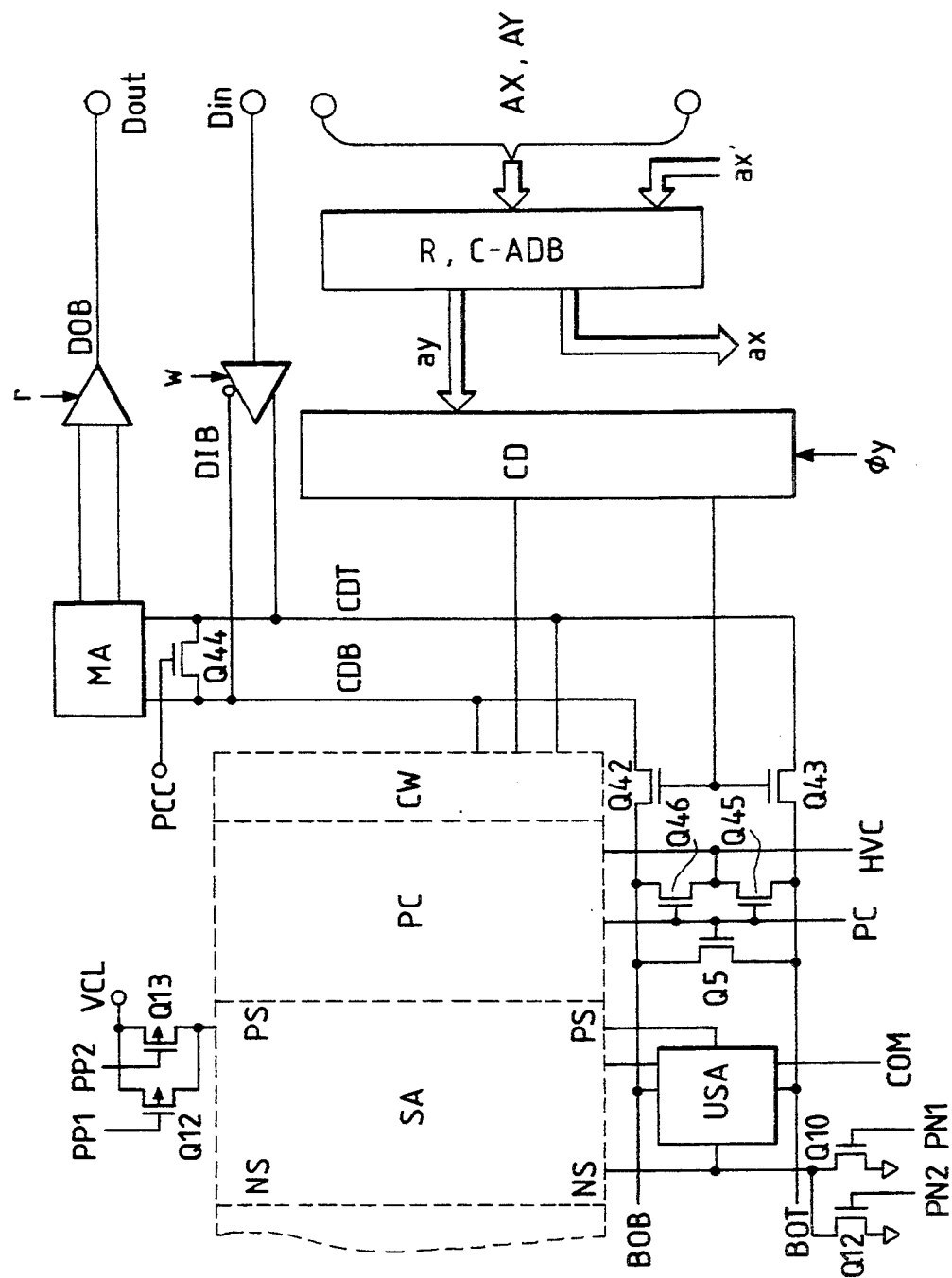
FIG. 32 is a circuit diagram of a sense amplifier and a column selecting circuit in a dynamic RAM according to the invention.
Figure 33:
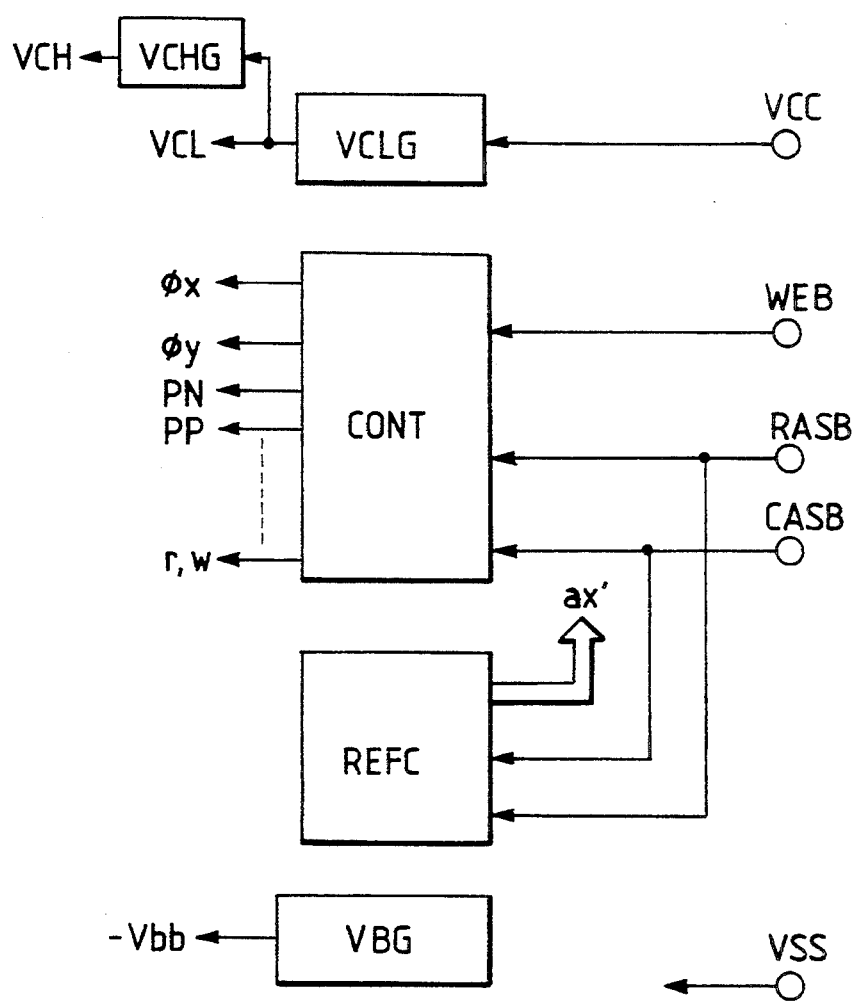
FIG. 33 is a block diagram of a control block and a power supply circuit in a dynamic RAM according to the invention.

FIGS. 31 through 33 are circuit diagrams of another dynamic RAM according to the invention. FIG. 31 is a circuit diagram of memory arrays and a row selecting circuit in the dynamic RAM; FIG. 32 is a circuit diagram of a sense amplifier and a column selecting circuit in the RAM; and FIG. 33 is a block diagram of a control block and a power supply circuit in the RAM. In FIGS. 31 and 32, the MOSFET's with their channel portions (back gates) pointed to by arrows are P-channel MOSFET's. This notation is different from the way in which the P-channel MOSFET's have their gates indicated (i.e., with circles) in FIGS. 2 and 3. With this invention, the MOSFET's are treated as insulated gate field effect transistors (IGFET's).

In FIG. 31, the memory array MARY operates on, but is not limited to, what is known as a folded bit line method. One pair of bit lines are illustratively shown in FIG. 31. The two complementary bit lines (data lines or digit lines) B0T and B0B arranged in parallel are connected in a regular manner to the input and output nodes of a plurality of memory cells composed of address selecting MOSFET's Qm and information storage capacitors Cs.

In FIG. 32, a pre-charge circuit PC comprises illustratively a switch MOSFET Q5, furnished interposingly between the complementary bit lines B0T and B0B. The MOSFET Q5 has its gate fed with the pre-charge signal PC generated in the chip non-selected state. The signal PC turns on the MOSFET Q5 when the transistor is in the chip non-selected state or before the memory cell is selected. Thus, in the preliminary operation cycle, the complementary bit lines B0B and B0B are short-circuited by amplification of a sense amplifier SA (to be described later) between the high and low levels to bring about a pre-charge voltage of about VCL/2 (HVC, or half-pre-charge voltage).

When the chip is left non-selected for a relatively long period of time, the pre-charge level is lowered by leakage currents, the drop being not limited thereby. In the example of FIG. 32, switch MOSFET's Q45 and Q46 are provided to supply the half-pre-charge voltage HVC. A voltage generating circuit for generating the half-pre-charge voltage HVC, not specifically shown, is constructed to have the ability to supply only relatively small currents. This arrangement is designed to minimize power dissipation.

The sense amplifier SA is deactivated before the pre-charge MOSFET Q5 and other related elements are turned on illustratively by placing the DRAM chip in the non-selected state. At this point, the complementary bit lines B0T and B0B are in the high impedance state, holding the high and low levels. With the RAM activated, the pre-charge MOSFET's Q5, Q45 and Q46 are turned off before the sense amplifier SA is turned on. Under this half-pre-charge scheme, the high and low levels of the complementary bit lines B0T and B0B are simply short-circuited to ensure low power dissipation.

According to the half-pre-charge scheme described above, the complementary bit lines B0T and B0B change between the high and low levels in a common mode centering on the pre-charge level during the amplifying operation of the sense amplifier SA. As a result, the level of the noise attributable to the capacitive coupling is lowered.

The sense amplifier SA has a circuit structure for offset compensation based on the capacitive coupling such as the arrangement shown in FIG. 6. Unlike the setup of FIG. 6 in which the separating MOSFET's and power switch MOSFET's are formed integrally, the sense amplifier SA has the sources of the separating MOSFET's connected to the source line NS while having the power switch MOSFET's furnished in the same manner as on the P-channel side.

In the example of FIG. 32, the supply voltage VCL is supplied via the P-channel MOSFET's Q12 and Q13 arranged in parallel, and the circuit ground voltage VSS is supplied via the N-channel MOSFET's Q10 and Q11. The power switch MOSFET's Q10 and Q11 and the MOSFET's Q12 and Q13 are shared by the unit sense amplifiers USA furnished in the same row of the same memory array. In other words, the P- and N-channel MOSFET's in the sense amplifier SA of the same memory array are connected commonly to the source lines PS and SN of the two channel types.

The gates of the MOSFET's Q10 and Q11 are fed with complementary timing pulses PN1 and PP1 which activate the sense amplifier SA in an operation cycle. The gates of the MOSFET's Q11 and Q13 are supplied with complementary timing pulses PN2 and PP2 which are delayed relative to the timing pulses PN1 and PP1. Thus, the operation of the sense amplifier SA is divided into two steps.

In the first step in which the timing pulses PN1 and PP1 are generated, a very small read voltage given across one pair of data lines from the memory cell is amplified, free of unwanted level fluctuations, by a voltage from the capacitive coupling described earlier. The very small read voltage is provided through the current limiting action of the MOSFET's Q10 and Q12, which each have a relatively small conductance. In the second step, the timing pulses PN2 and PP2 are generated after the difference in complementary data line potential is amplified by the sense amplifier SA. Then, the MOSFET's Q11 and Q13, which each have a relatively large conductance, are turned on.

The amplifying operation of the sense amplifier SA is made faster when the MOSFET's Q11 and Q13 are turned on. The two-step amplification of the sense amplifier SA permits a high-speed data read operation while preventing unwanted level fluctuations on the complementary data lines. In the above two steps, the disconnected bit lines B0T and B0B are connected again by a switch MOSFET, not shown, to effect another write operation to the memory cell. This unshown switch MOSFET is not necessarily limited to a bit line reconnection arrangement.

In FIG. 31, an X (i.e, row) address decoder comprises, but is not limited to, a first address decoder circuit illustratively made of gate circuits G1 through G4, and a second address decoder circuit composed illustratively of a unit circuit UXDCR. FIG. 31 actually contains the unit circuit UXDCR constituting the second address decoder circuit, and NOR gate circuits G1 through G4 making up the first address decoder circuit. Reference characters are omitted for the gate circuits G2 and G3 for space reasons. The unit circuit UXDCR generates decode signals destined to four word lines.

The four gate circuits G1 through G4 constituting the first X address decoder generate four word line selection timing signals $\phi x0$ through $\phi x3$. The four timing signals are derived from the combinations of word line selecting signals X0B, X0T, X1B and X1T corresponding to a low-order two-bit address signal. The word line selection timing signals $\phi x0$ through $\phi x3$ are input to unit word line driver circuits UWD0 through UWD3 via transmission gate MOSFET's Q20 through Q23.

The word line driver WD, of which the unit circuit UWD0 is shown illustratively, comprises a CMOS driving circuit made of a P-channel MOSFET Q26 and an N-channel MOSFET Q27, and P-channel MOSFET's Q24 and Q25 furnished interposingly between the input of the CMOS driving circuit and an operating voltage terminal VCH. The gate of the P-channel MOSFET Q24 is fed with a pre-charge signal wph whose level is converted by a level conversion circuit. The gate of the P-channel MOSFET Q25 is supplied with the driving output from the word line W0.

When the word line selection timing signal $\phi x0$ generated in accordance with the internally stepped-down voltage VCL is brought High to set the word line W0 at the non-selected level such as ground potential, the MOSFET Q25 receives the low level of the word line W0 to pull up the input level of the CMOS circuit to the high voltage VCH. With the CMOS circuit input level pulled up, the MOSFET's Q26 is turned off unfailingly. This arrangement prevents dissipation of direct currents between the P-channel MOSFET's Q26 and Q27 constituting the CMOS driving circuit corresponding to the non-selected word lines.

Where the X address decoder is divided into two blocks, as described, the pitch of the unit circuits UXDCR making up the second X address decoder circuit is aligned with the pitch of the word lines. As a result, unproductive space is reduced to a minimum on the semiconductor substrate.

Switch MOSFET's Q1 through Q4 are furnished between the extreme side of the word lines and the circuit ground potential. The gates of the switch MOSFET's Q1 through Q4 are supplied with WC0 through WC3 whose phases are opposite to those of the selection signals fed to the corresponding word lines W0 through W3. This turns off only the switch MOSFET corresponding to the selected word line and turns on the rest of the switch MOSFET's. As a result, the non-selected word lines are prevented from becoming inadvertently raised to an intermediate potential due to the capacitive coupling of the selected word line being raised.

In FIG. 32, a row (X) address buffer R-ADB is activated with a timing signal, not shown, generated by a control circuit CONT (described later) in accordance with a row address strobe signal RASB fed from an external terminal. In its activated state, the row (X) address buffer R-ADB obtains and holds an address signal AX fed from an external terminal in synchronism with the row address strobe signal RASB. At the same time, the row (X) address buffer R-ADB generates an internal complementary address signal ax whose level is converted according to the stepped-down voltage VCL, and sends that address signal to the first and the second row address decoders. The internal complementary address signal ax is composed of a pair of signals, i.e., an in-phase signal and an out-of-phase signal corresponding to the address signal AX supplied from the external terminal.

Also in FIG. 32, a column (Y) address buffer C-ADB is activated with a timing signal, not shown, generated by the control circuit CONT (described later) in accordance with a column address strobe signal CASB fed from an external terminal. In its activated state, the column (Y) address buffer C-ADB obtains and holds an address signal AY fed from an external terminal in synchronism with the column address strobe signal CASB. At the same time, the column (Y) address buffer C-ADB generates an internal complementary address signal ay whose level is converted according to the stepped-down voltage VCL, and sends that address signal to a column decoder CD. The internal complementary address signal ay is composed of a pair of signals, i.e., an in-phase signal and an out-of-phase signal corresponding to the address signal AY supplied from the external terminal. In FIG. 32, the row address buffer R-ADB and the column address buffer C-ADB are represented by the generic address buffer R, C-ADB.

The column decoder CD is basically composed of an address decoder circuit resembling the X address decoder. Given the complementary address signal ay from the column address buffer C-ADB, the column decoder CD interprets the signal and generates accordingly a selection signal destined to a column switch CS in synchronism with a data line selection timing signal $\phi y$.

The column switch CW, composed illustratively of N-channel MOSFET's Q42 and Q43, connects selectively the complementary bit lines B0T and B0B to complementary common I/O lines CDT and CDB. The gates of the MOSFET's Q42 and Q43 are supplied with a selection signal from the column decoder CD.

Between the common I/O lines CDT and CDB is an N-channel pre-charge MOSFET Q44 constituting a pre-charge circuit similar to that described above. The MOSFET Q44 is controlled with a pre-charge signal PCC. The common I/O lines CDT and CDB are connected to a pair of I/O nodes of a main amplifier MA whose circuit constitution is similar to that of the unit sense amplifier USA.

An amplification output signal of the main amplifier MA is sent to the outside from an external terminal Dout past a data output buffer DOB. In read operation mode, the data output buffer DOB is activated with a timing signal r. The main amplifier MA activated at this point has its signal amplified and output to the external terminal Dout after the signal is converted to the level corresponding to the external supply voltage VCC. In write operation mode, the timing signal r puts the output terminal Dout of the data output buffer DOB in the high impedance state.

The common I/O lines CDT and CDB are connected to the output terminals of a data input buffer DIB. In write operation mode, the data input buffer DIB is activated with a timing signal w. A complementary write signal provided as per a write signal fed from an external terminal Din is converted to the level corresponding to the internally stepped-down voltage VCL. The resulting signal is sent to the common I/O lines CDT and CDB, whereby data is written into the selected memory cell. In read operation mode, the timing signal w puts the output of the data input buffer DIB in the high impedance state.

In FIG. 33, the diverse timing signals mentioned above are shown as being generated by the control circuit CONT. These major timing signals are among the timing signals generated by the control circuit CONT for operating the RAM. More specifically, the control circuit CONT generates the various timing pulses upon receipt of the address strobe signals RASB and CASB and a write enable signal WEB fed from external terminals.

Reference characters REFC denote an automatic refresh circuit that includes a refresh address counter. The automatic refresh circuit REFC operates in the manner described below, but is not limited thereby. When a logic circuit for receiving the address strobe signals RASB and CASB brings the column address strobe signal CASB Low before bringing the row address strobe signal RASB Low, the automatic refresh circuit REFC recognizes refresh mode. Then, the refresh circuit REFC outputs a refresh address signal ax' generated by an address counter circuit utilizing the row address strobe signal RASB as its clock signal.

The refresh address signal ax' is forwarded to the row address decoder circuit via the row address buffer R-ADB having a multiplexer function. As a result, the refresh control circuit REFC in refresh mode generates a control signal, not shown, for switching the address buffer R-ADB. This triggers a refresh operation through the selection of one word line corresponding to the refresh address signal ax' (CAS-before-RAS refresh).

An internal step-down circuit VCLG receives the supply voltage VCC such as 5 V fed from an external terminal, and generates a stabilized, internally stepped-down voltage VCL illustratively at about 3.3 V accordingly. An internal step-up circuit VCHG receives a pulse signal derived from the internally stepped-down stable voltage VCL, and generates, accordingly, a stepped-up voltage necessary for selecting a word line. A substrate voltage generating circuit VBG generates a negative bias voltage −Vbb to be applied to the substrate upon receipt of the pulse signal generated as per the stabilized, internally stepped-down voltage VCL. It should be noted that this is not limiting us to how the substrate voltage generating circuit VBG works.

FIG. 1 is a chip layout view of a dynamic RAM using sense amplifiers according to the invention. The dynamic RAM of this example is designed to have a capacity of about 16 megabits.

The memory array is divided into eight blocks of about two megabits each. Sense amplifiers SA are located between every two blocks. A total of 8,192 sense amplifiers are provided. Row decoders RD and word drivers WD are flanked by two pairs of blocks, and are perpendicular to the columns of sense amplifiers. Two columns of column decoders CD, or a column decoder CD and a data register DR, are located at the center of the chip and arranged in the longitudinal direction thereof.

In a single memory array block, the number of memory cells NSA connected to the sense amplifiers SA is 1,024 per bit line. The number of memory cells NWD connected to each word line is 2,048.

Where as many as 1,024 memory cells are connected to one bit line, the bit lit capacitance CB is inordinately increased. Because of circuit integration constraints on the memory cell size, the levels of signals read out to the bit lines are reduced correspondingly.

Figure 10:
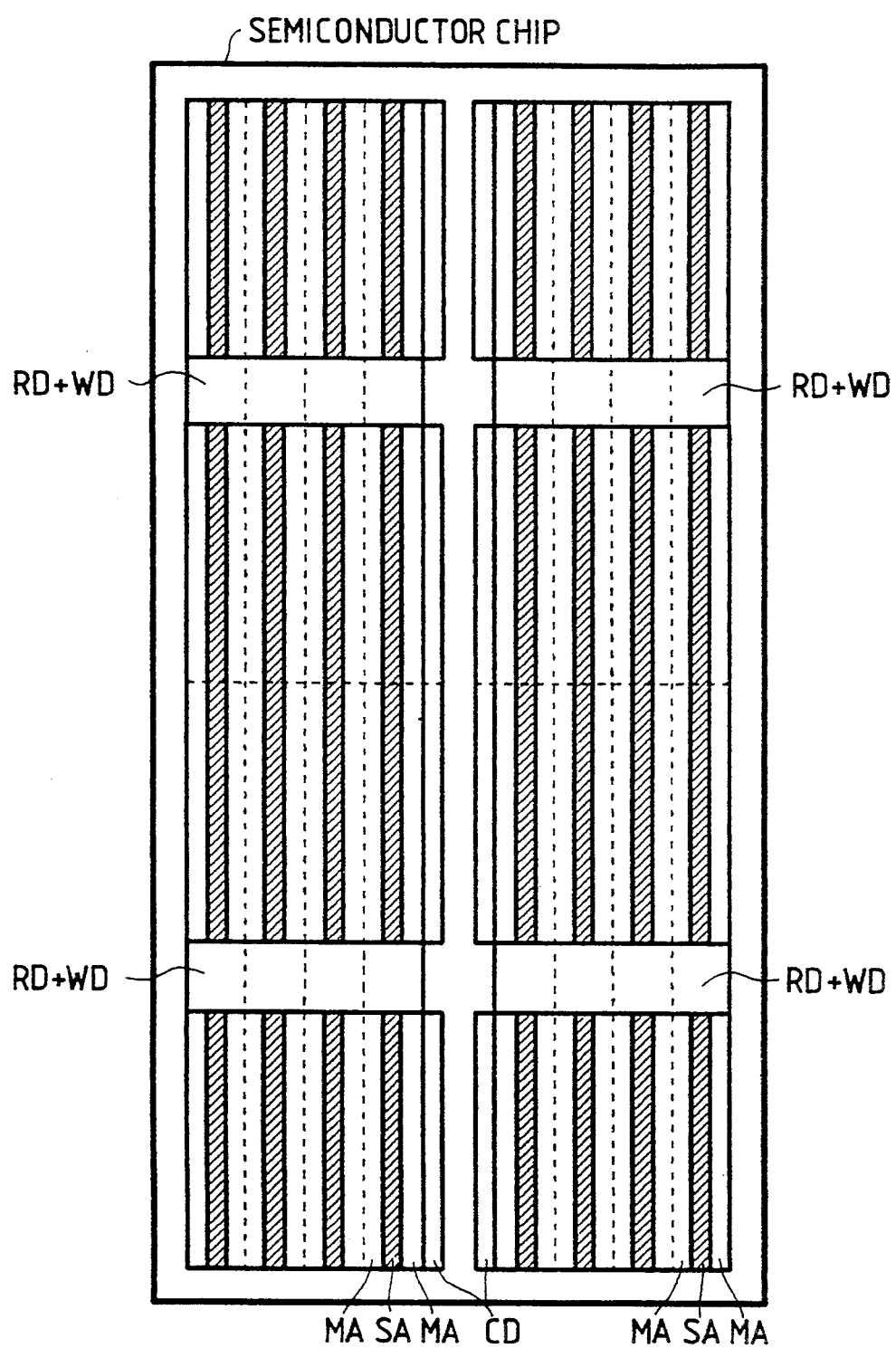
FIG. 10 is a chip layout view of a dynamic RAM using conventional sense amplifiers.

The dispersion of the threshold voltage for a pair of MOSFET's constituting each sense amplifier is generally 50 mV. It follows that a minimum of 100 mV is required as a signal voltage to be read on the bit lines. This means that where conventional sense amplifiers are involved, each bit line is connected to at most 256 memory cells, as shown in FIG. 10. Likewise, one word line is connected to a maximum of about 1,024 memory cells. As a result, a large proportion of the semiconductor chip, shown shaded in FIG. 10, is occupied by the sense amplifiers. This has been a major impediment to making the chip smaller in size and/or higher in the degree of circuit integration.

By contrast, the sense amplifiers according to the invention compensate for the input offset, i.e., the dispersion of the threshold voltages for the MOSFET's. If the operating margins are the same as with their conventional counterparts, the inventive sense amplifiers allow the signal level on each bit line to be as low as 50 mV. This makes it possible to make the parasitic capacitance of bit lines CB at least 20 times the capacitance of memory cells CS, compared with up to a CB/CS ratio of 10 in conventional setups.

Where the CB/CS ratio is 20 and the bit line potential is 3 V, the read signal level is given by the following expression:

$$3(V) \times 1/(20+1) \times \tfrac{1}{2} = 71 \text{ (mV)} \tag{1}$$

Likewise, the signal level is about 60 mV for the bit line potential of 2.5 V, 48 mV for 2 V and 36 mV for 1.5 V. It will be appreciated that read operations are possible for up to 2.5 V without making the operation speed lower than those of conventional circuits.

The input offset compensation effected by the sense amplifiers as described above makes it possible to raise the number of memory cells connected to one bit line to 1,024, as well as to increase significantly the number of memory cells connected to each word line. As a result, the semiconductor chip of FIG. 1 is about 62% of the conventional chip of FIG. 10 in terms of size while maintaining approximately the same storage capacity. For the dynamic RAM of FIG. 1 having the capacity of about 16 megabits, the rate of memory cell occupancy on the substrate is at least 80%, compared with about 50% for the dynamic RAM of FIG. 10.

With the layout of FIG. 1 used unmodified, a dynamic RAM with a capacity of about 32 megabits may also be manufactured. In that case, the memory cell count NSA is left unchanged while the count NWD is boosted to 4,096. If the rate of memory cell occupancy is 80%, a dynamic RAM having twice the capacity of the setup in FIG. 10 is obtained with a chip surface increase of only about 25% over the conventional memory.

When manufactured with conventional techniques, mass-storage dynamic RAM's of 64 megabits or higher tend to further reduce the rate of memory cell occupancy on the substrate. Under identical design rules, a conventional dynamic RAM of about 64 megabits with a memory cell occupancy rate of 45% has the same chip area as a dynamic RAM of about 128 megabits with a memory cell occupancy rate of 90% according to the invention.

Figure 11:
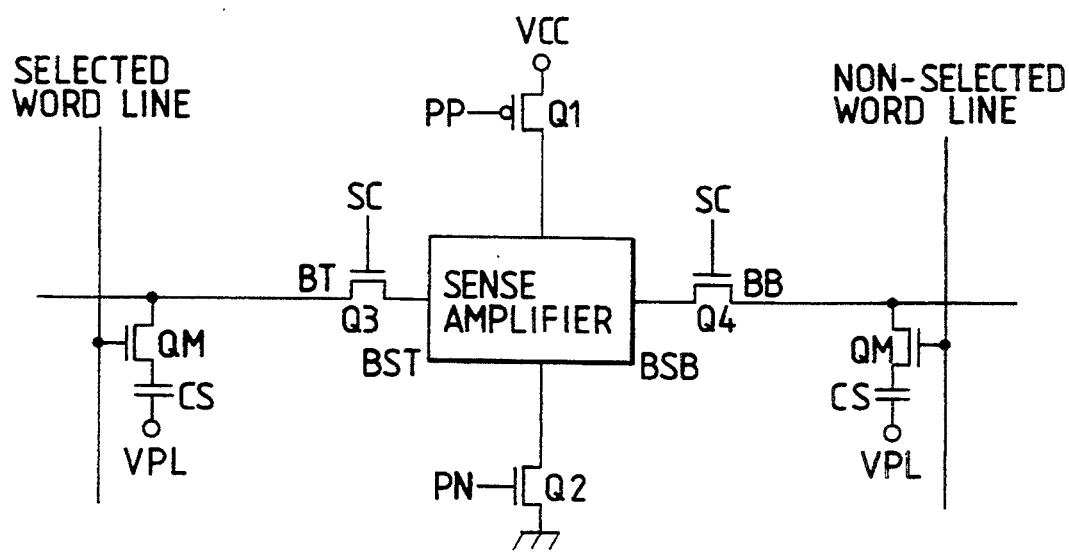
FIG. 11 is a partial circuit diagram of another dynamic RAM embodying the invention.

FIG. 11 is a partial circuit diagram of another dynamic RAM embodying the invention. The example of FIG. 11 utilizes a sense amplifier compensating for the dispersion of threshold voltages for paired MOSFET's similar to the arrangements shown in FIGS. 2 and 3. The setup is intended to boost the operation speed and stabilize the operation involved.

FIG. 11 illustrates one sense amplifier, a pair of complementary bit lines, and two memory cells each connected to each bit line. Switch MOSFET's Q3 and Q4 are furnished interposingly between I/O nodes BST and BSB of the sense amplifier on the one hand, and between the complementary bit lines BT and BB on the other. The gates of the switch MOSFET's Q3 and Q4 are fed with a control signal SC. The amplifying operation of the sense amplifier is started by operation of the P-channel power switch MOSFET Q1 and the N-channel power switch MOSFET Q2. The gates of the power switch MOSFET's Q1 and Q2 are supplied with control signals PP and PN.

It is to be understood that the sense amplifier has all control and timing signals needed to operate the pre-charge and auxiliary pre-charge circuits that compensate for the dispersion of threshold voltages for the paired MOSFET's such as those shown in FIGS. 2 and 3.

Figure 12:
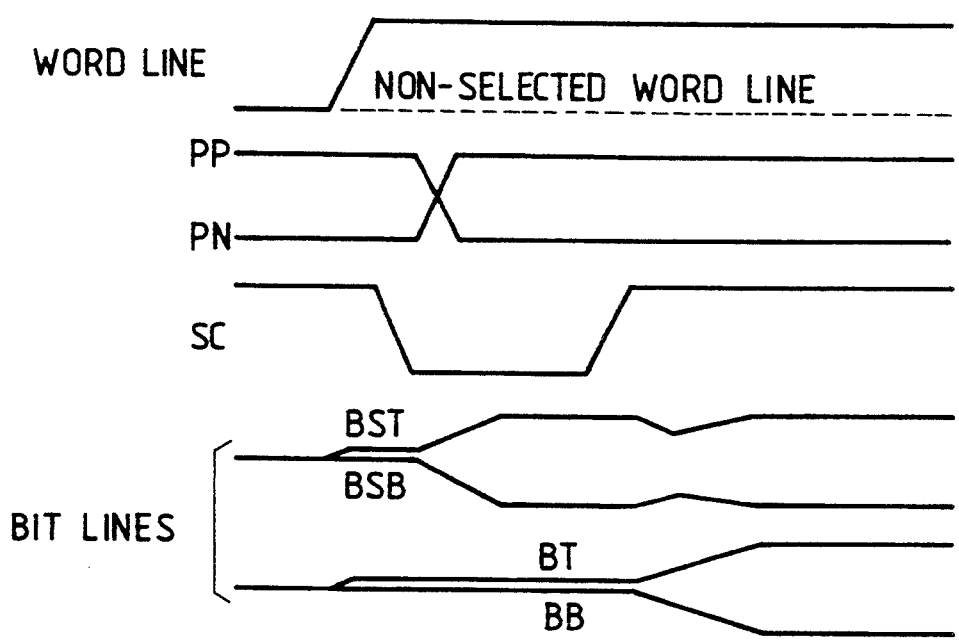
FIG. 12 is a timing chart of the sense amplifier included in FIG. 11.

FIG. 12 is a timing chart of the sense amplifier shown in FIG. 11, depicting how it operates. A pre-charge operation is carried out by an auxiliary pre-charge circuit, not shown, with the control signal PC brought High, i.e., with the sense amplifier connected to the complementary bit lines BT and BB.

When a selected word line is brought High, the switch MOSFET of the memory cell connected to the selected word line is turned on. This causes the selected bit lines to develop a very low voltage corresponding to the charge coupling composed of the charges accumulated in the memory cell capacitance CS and of the pre-charges on the bit lines.

When the very small read signal of the above kind is input to the I/O nodes BST and BSB of the sense amplifier, the control signal SC is brought Low to turn off the switch MOSFET's Q3 and Q4. In this state, the control signal PP of the sense amplifier is brought Low and the signal PN High to start the amplifying operation. Since the parasitic capacitances of the I/O nodes BST and BSB of the sense amplifier are kept small, the very small read signal is rapidly extended to the high and low levels.

With the I/O nodes BST and BSB extended to the high and low levels, the control signal SC is brought High for reconnection to the bit lines BT and BB. When the bit lines BT and BB having the large parasitic capacities are reconnected to the sense amplifier, the tendency would be for the I/O nodes BST and BSB to return to their original state, except that the amplifying operation of the sense amplifier extends the bit lines BT and BB to the high and low levels.

The amplifying operation described above amplifies at high speed the signals on I/O nodes BST and BSB having small parasitic capacitances free of various adverse effects. That is, the very small read signal is amplified by the sense amplifier free of such detrimental factors as the noise on the bit lines BT and BB and a parasitic capacitance imbalance between the bit lines BT and BB.

With the dispersion of threshold voltages for the paired MOSFET's compensated, drops in the signal levels are supplemented for the increased number of memory cells connected to the bit lines. This makes it possible to ensure necessary operating margins while maximizing the number of memory cells that may be connected to each bit line.

Figure 13:
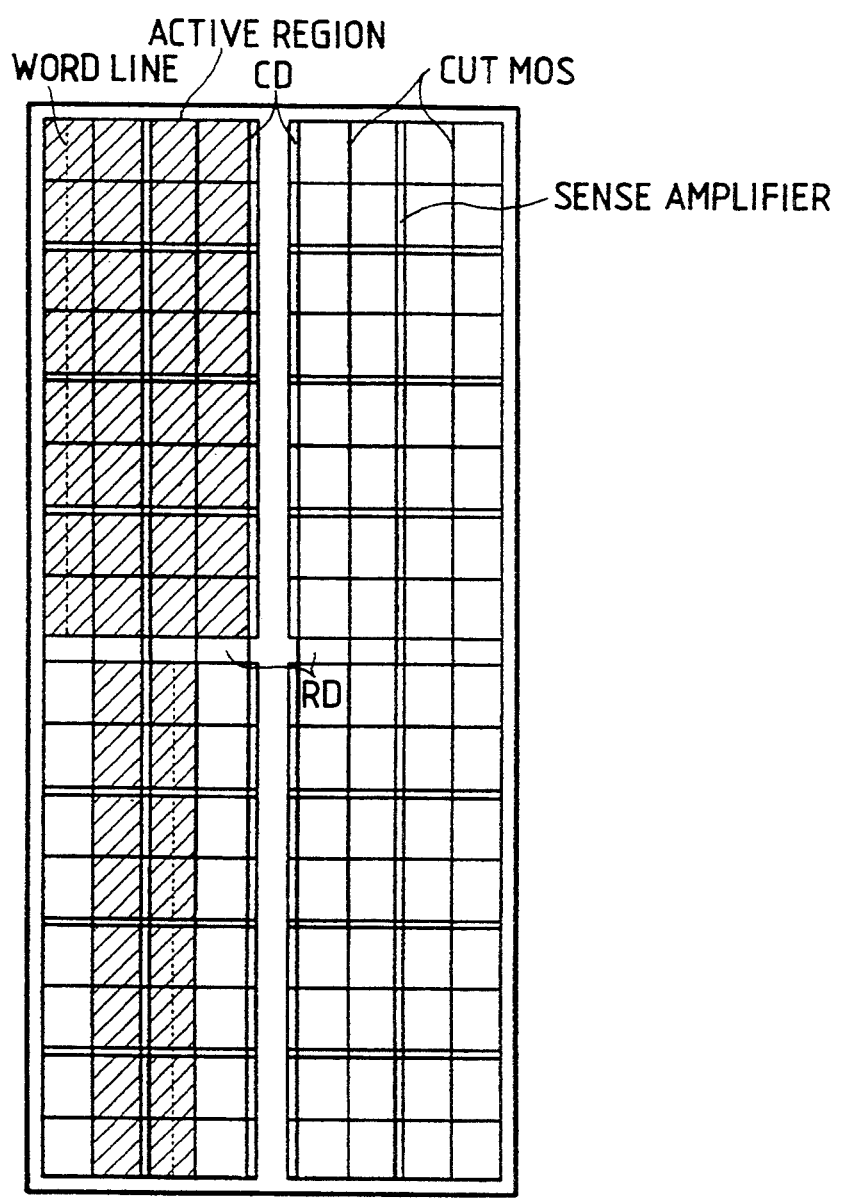
FIG. 13 is a schematic chip layout view of another dynamic RAM embodying the invention.

FIG. 13 is a schematic chip layout view of another dynamic RAM embodying the invention. In this example, the memory array is divided into four blocks. Sense amplifiers are located in the middle of each memory array block and in the longitudinal direction thereof. Complementary bit lines are arranged on, but not limited to, both sides of the sense amplifiers which are arranged in the middle. That is, the complementary bit lines are not folded at the sense amplifiers, but are instead cut off thereby (i.e., cut MOSFET's).

The word lines are selected, but not limited, by a row decoder RD positioned in the middle of the chip. Each word line is long because it is connected to as many as 2,048 memory cells. A short pitch between the word lines increases the parasitic capacitance therebetween. Three word clear circuits dividing each word line into four equal parts are furnished for two purposes: to prevent a non-selected word line from being raised by the coupling to the adjacent selected word line, and to reset the word lines at high speed.

A total of seven word line shunt areas for minimizing the word line resistance are provided to divide each word line, including the word clear circuits, into eight equal parts. These dedicated word line shunt areas are indicated by four lines extending horizontally over each memory array block.

In the example of FIG. 13, a special scheme is adopted to reduce power dissipation. It is assumed here that only one memory array is selected during an ordinary memory access operation. The scheme works as follows: if a word line outside the cut MOSFET relative to the sense amplifier is selected, the cut MOSFET is turned on; if a word line inside the cut MOSFET is selected, the cut MOSFET is turned off. This scheme reduces the parasitic capacitance of the bit lines approximately by half. As a result, the charging and discharging currents are reduced correspondingly when the sense amplifier performs its amplifying operation.

To reduce the number of refresh cycles in refresh mode requires selecting a plurality of word lines at a time. This involves a growing number of sense amplifiers that need to be operated. Thus, the current dissipation of the dynamic RAM is determined by the current dissipation in refresh mode. In a dynamic RAM where the above-described cut MOSFET's are provided, word lines of two memory arrays may be selected concurrently in refresh mode through the address assignment described below.

Figure 14A:
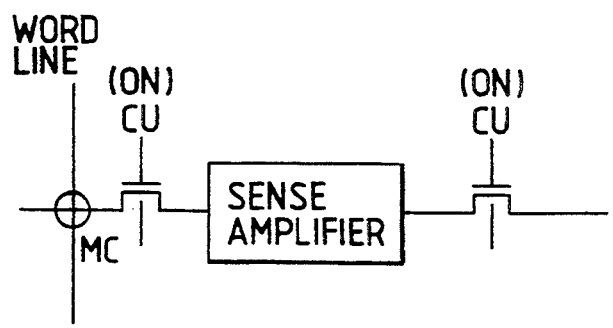
FIGS. 14(A) through 14(C) are views depicting how the dynamic RAM of FIG. 13 works.
Figure 14B:
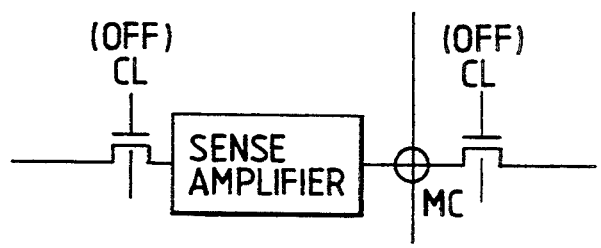

Suppose that in FIG. 13, two memory arrays on the left-hand side of the semiconductor chip are refreshed at the same time. In the upper memory array, a word line outside the cut MOSFET relative to the sense amplifier is selected as shown in FIG. 14(A), whereas in the lower memory array, the word line inside the cut MOSFET relative to the sense amplifier is selected, as depicted in FIG. 14(B). Conversely, if the word line inside the cut MOSFET is selected in the upper memory array, the word line outside the cut MOSFET is selected in the lower memory array. The same also applies to the refresh operation performed on the two memory arrays on the right-hand side.

When the word line outside the cut MOSFET is selected in the upper memory array and the word line inside the cut MOSFET is selected in the lower memory array, as shown in FIGS. 14(A) and 14(B), the cut MOSFET in the upper memory array is kept on while the cut MOSFET in the lower memory array is turned off. This scheme reduces the current consumption of the sense amplifiers in the lower memory array almost by half. The savings on the current consumption translate into a one-fourth reduction of the operation current in the refresh mode. Besides bisecting the bit lines, the cut MOSFET's may alternatively divide the bit lines into four or more equal parts. When an increased number of cut MOSFET's disconnect the bit lines outside the selected word line, further reductions in power dissipation are achieved.

Figure 14C:
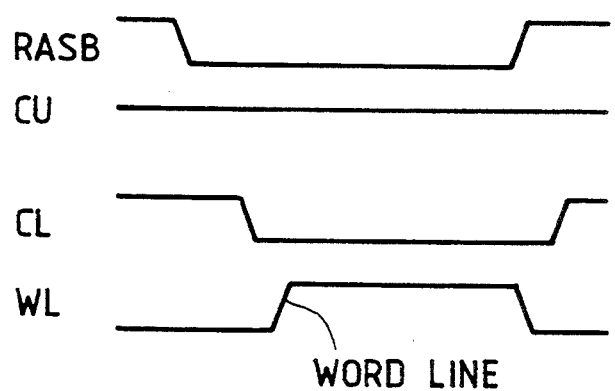

FIG. 14(C) is a timing chart depicting how the dynamic RAM of FIG. 13 works in refresh mode. Bringing the row address strobe signal RASB Low carries out a refresh address increment operation (CAS-before-RAS refresh). As shown in FIGS. 14(A) and 14(B), the control signal CU of the upper memory array is held High, and a word line WL is selected after the control signal CL of the lower memory array is brought Low. This causes a sense amplifier activating signal, not shown, to activate the sense amplifier into a refresh operation wherein data is read from the selected memory cell and the read signal is amplified and rewritten back to the original memory cell.

Figure 15:
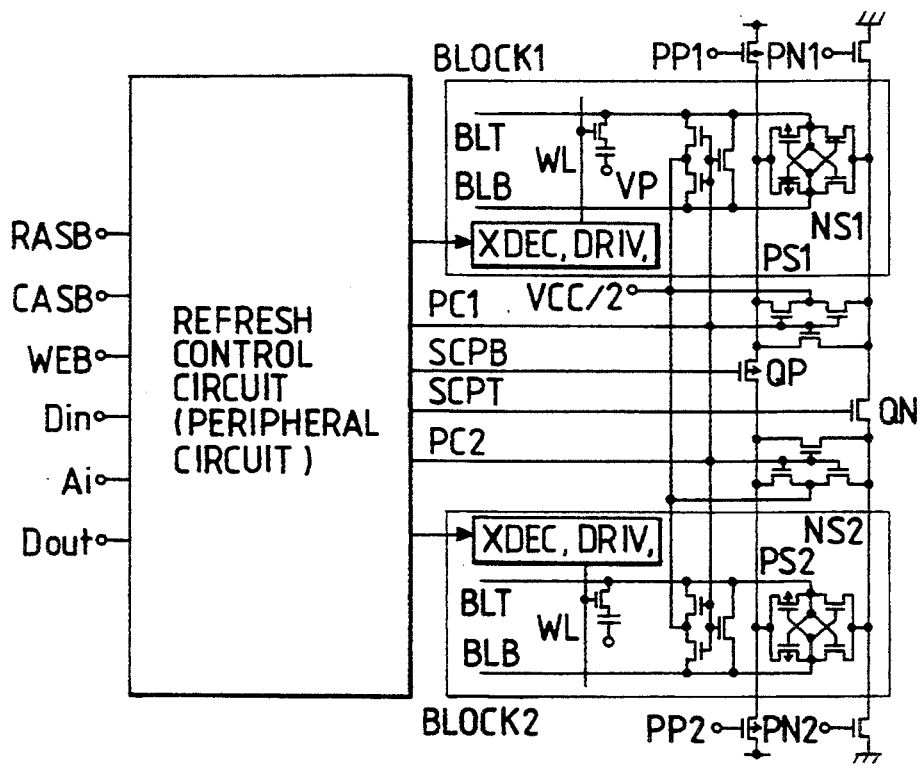
FIG. 15 is a schematic circuit diagram of another dynamic RAM embodying the invention.

FIG. 15 is a schematic circuit diagram of another dynamic RAM embodying the invention. In this example, memory cells are selected in a fixed sequence in the dynamic RAM operating in refresh mode. In other words, the memory cells are accessed serially in the refresh mode whereas they are accessed randomly in the read or write modes. This aspect of the refresh mode is taken advantage of in reducing the power dissipation of the sense amplifiers.

With the example of FIG. 15, two memory blocks (memory array) will now be described for a better understanding of the invention. The common source lines PS1 and NS1 of the sense amplifier in the block 1 are furnished with P- and N-channel power switch MOSFET's which are controlled by control signals PP1 and PN1. Similarly, the common source lines PS2 and NS2 of the sense amplifier in the block 2 are provided with P- and N-channel power switch MOSFET's which are controlled by control signals PP2 and PN2.

The sense amplifiers are represented by CMOS latch circuits for ease of description. In the example of FIG. 15, the signal level drops primarily in two cases: when the signal level on the bit lines is lowered with a large number of memory cells connected to the bit lines, and when the signal level is lowered when the high-level voltage of the bit lines (to be described later), i.e., operating voltage of the sense amplifier, is reduced. This requires incorporating a function for compensating for the dispersion of threshold voltages for the paired MOSFET's, as in the previous example.

The common source lines PS1, NS1, PS2 and NS2 are furnished with pre-charge circuits similar to those provided to complementary bit lines BLT and BLB of the memory array. These pre-charge circuits are supplied with the half-pre-charge voltage VCC/2, as well as with pre-charge signals PC1 and PC2 corresponding to the blocks 1 and 2.

In the two memory blocks of the example in FIG. 15, a P-channel switch MOSFET QP is provided between the common source lines PS1 and PS2, and an N-channel switch MOSFET QN is furnished between the common source lines NS1 and NS2. The gates of these switch MOSFET's QP and QN are fed with control signals SCPB and SCPT generated in accordance with the address signal from the refresh control circuit.

Figure 16:
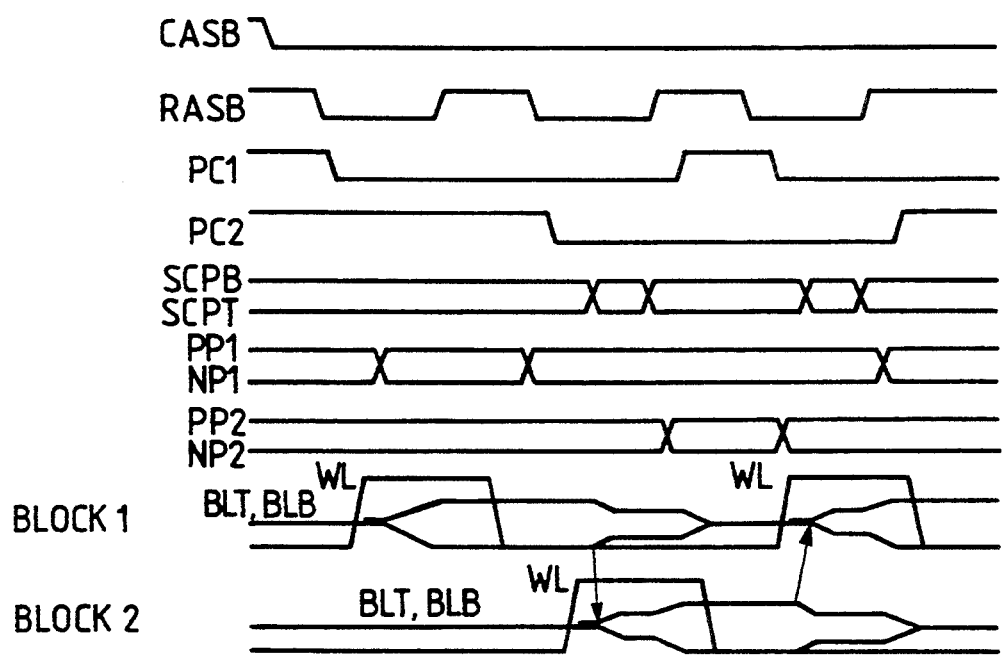
FIG. 16 is a timing chart showing how the dynamic RAM of FIG. 15 works.

FIG. 16 is a timing chart showing how the dynamic RAM of FIG. 15 operates in the refresh mode. Refresh mode (CBR refresh mode) is entered when the column address strobe signal CASB is brought Low before the row address strobe signal RASB.

Bringing the signal RASB Low starts an address increment operation. Before the block 1 is refreshed, the pre-charge signal PC1 is brought Low to turn off the MOSFET's of the pre-charge circuit. This places the complementary bit lines BLT and BLB of the memory array and the common source lines PS1 and PN1 of the sense amplifier in the high impedance state in the block 1.

When one word line WL is selected by an X decoder XDEC and a word line driver DRIV corresponding to the block 1, data is read from the selected memory cell onto the bit lines BLT and BLB. The signals PP1 and PN1 activate the sense amplifier corresponding to the block 1. This, in turn, amplifies the very small signal that is read between the complementary bit lines BLT and BLB, extending that signal to the high and low levels.

The memory cell, from which data was read and whose charges were about to be lost thereby, is refreshed when the high or low level of the bit lines BLT and BLB is written back thereto. The high or low level is acquired through expansion of the read signal executed by the amplifying operation of the sense amplifier.

With the refresh operation completed in the block 1, the pre-charge signal PC is held Low. When the signal RASB is reset to the high level and then brought Low again, an address increment operation is carried out. This causes the pre-charge signal PC2 of the block 2 to go Low before the block 2 is refreshed in place of the block 1. As a result, the complementary bit lines BLT and BLB of the memory array and the common source lines PS2 and PN2 of the sense amplifier are placed in the high impedance state in the block 2.

When one word line WL is selected by an X decoder XDEC and a word line driver DRIV corresponding to the block 2, data is read from the selected memory cell onto the bit lines BLT and BLB. Before the sense amplifier corresponding to the block 1 is activated by the signals PP1 and PN1, the control signal SCPB is brought Low and the signal SCPT is made High to turn on the switch MOSFET's QP and QN. This, in turn, short-circuits the common source lines PS1 and PS2, as well as NS1 and NS2.

The common source lines PS1 and NS1 are placed in the high impedance state since the preceding refresh operation while the high and low levels are held unchanged. Thus, the short-circuiting above causes the operating current to run to the sense amplifier of the block 2, thereby effecting the initial amplifying operation. Thereafter, the signal SCPB is brought High and the signal SCPT Low is made to turn off the switch MOSFET's QP and QN. The signals PP2 and PN2 activate the sense amplifier corresponding to the block 2. This eventually brings to the high and low levels the potential of the bit lines that have been raised to an intermediate level by the above amplifying operation.

With the refresh operation completed in the block 2, the pre-charge signal PC2 is held Low. When the signal RASB is reset to the high level and then brought Low again, an address increment operation is carried out. This causes the pre-charge signal PC2 of the block 1 to go High temporarily to pre-charge by half the common source lines PS1 and NS1 complementary to the bit lines BLB and BLT, before the block 1 is refreshed in place of the block 2. Upon completion of the pre-charging, the signal PC1 is brought Low. As a result, the complementary bit lines BLT and BLB of the memory array and the common source lines PS2 and PN2 of the sense amplifier are placed in the high impedance state in the block 1, whereby the pre-charge potential is maintained. The pre-charge operation short-circuits the intermediate high and low levels generated by connection of the common source lines PS2 and NS2, which brings about the half-pre-charge voltage such as VCC/2.

When one word line WL is selected by the X decoder XDEC and word line driver DRIV corresponding to the block 1, data is read from the selected memory cell onto the bit lines BLT and BLB. Before the signals PP1 and PN1 activate the sense amplifier corresponding to the block 1, the control signal SCPB is brought Low and the signal SCPT is made High to turn on the switch MOSFET's QP and QN. This short-circuits the common source lines PS1 and PS2, as well as PS1 and NS2.

The common source lines PS2 and NS2 are in the high impedance state since the preceding refresh operation of the block 2 with the high and low levels held unchanged. The above short-circuiting causes the operating current to flow to the sense amplifier of the block 1, thereby carrying out the initial amplifying operation. Thereafter, the signal SCPB is brought High and the signal SCPT is made Low to turn off the switch MOSFET's QP and QN. The signals PP1 and PN1 activate the sense amplifier corresponding to the block 2. This eventually brings to the high and low levels the potential of the bit lines that have been raised to an intermediate level by the above amplifying operation.

In like manner, the blocks 1 and 2 are refreshed alternately. Except for the first address of the refresh cycle, each address is refreshed using, as part of the amplification current of the sense amplifier, the charges accumulated in the common source lines of the sense amplifier corresponding to the immediately preceding address refreshed. This scheme reduces the current dissipation of the sense amplifiers approximately by half.

In the present example, two memory blocks are refreshed alternately. However, the invention is not limited to this scheme. Alternatively, where the memory array is divided into four parts, as shown in FIG. 13, the addresses may be refreshed in circular fashion among the four memory array blocks, and the common source lines may be connected accordingly. In that case, higher charges (i.e., larger currents) are available for use in the initial amplifying operation of the sense amplifier to be refreshed. This leads to further reductions in the sense amplifier currents.

As another alternative, the examples of FIGS. 13 and 15 may be used in combination. Of the four memory array blocks in FIG. 13, the upper and lower pairs of memory array blocks are refreshed according to the scheme of FIG. 13; the right- and left-hand pairs of memory array blocks are refreshed as per the scheme of FIG. 15. That is, when the two left-hand side memory array blocks are refreshed simultaneously, the refresh current is reduced under control of the bit line cut MOSFET's; when the two right-hand side memory blocks are refreshed, the charges of the common source lines of the sense amplifier on the left-hand side are used as the operating current for the right-hand side sense amplifier that is about to start the amplifying operation by short-circuiting the common source lines. At this point, the bit line capacitance is reduced by half by the cut MOSFET's in one of the two right-hand side memory array blocks.

Again, in the two left-hand side memory array blocks, the bit line capacitance is reduced by half by the cut MOSFET's, and the charges of the common source lines for the sense amplifier on the right-hand side are used as the operating current for the left-hand side sense amplifier that is about to start the amplifying operation by short-circuiting the common source lines. Thereafter, the same process is repeated so that the refresh current is drastically reduced.

Figure 17:
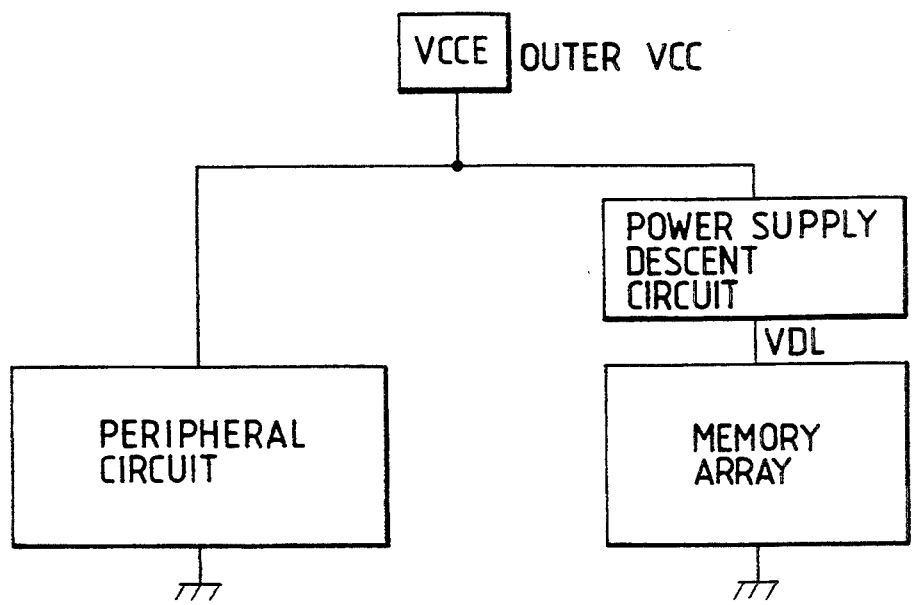
FIG. 17 is a schematic block diagram of another dynamic RAM embodying the invention.

FIG. 17 is a schematic block diagram of another dynamic RAM embodying the invention. In the example of FIG. 17, the sense amplifiers included in the memory array compensate for the dispersion of threshold voltages for the paired MOSFET's such as those in FIG. 2. These sense amplifiers designed for high sensitivity need only low signal levels to operate. In the setup of FIG. 17, this aspect of the sense amplifiers is taken advantage of in implementing mass storage and in reducing the power dissipation involved.

When the high level supplied to the bit potential is as low as 2.5 V, the level of charges stored in the capacitor is lowered correspondingly, which, in turn, reduces the read signal level. However, this phenomenon is beneficial from the viewpoint of power dissipation because reductions in the signal amplitude of the bit potential bring about drops in the charging and discharging currents. The result is a reduced level of power dissipation.

In the example of FIG. 17, the dynamic RAM is divided into two major parts: the memory array, and peripheral circuits including an address selecting circuit. The supply voltage VCC given from the outside is supplied unmodified to the peripheral circuits, whereas the memory array is fed with a supply voltage VDL obtained using a power supply step-down circuit lowering the original supply voltage. For example, if a supply voltage VCC of 5 V is fed from an external terminal VCCE, the memory array utilizes a stepped-down voltage VDL of 3 V or 2.5 V. If the external terminal VCCE feeds the supply voltage VCC as low as 3 V, the memory array is given a stepped-down voltage VDL of 2 to 1.5 V.

Figure 18:
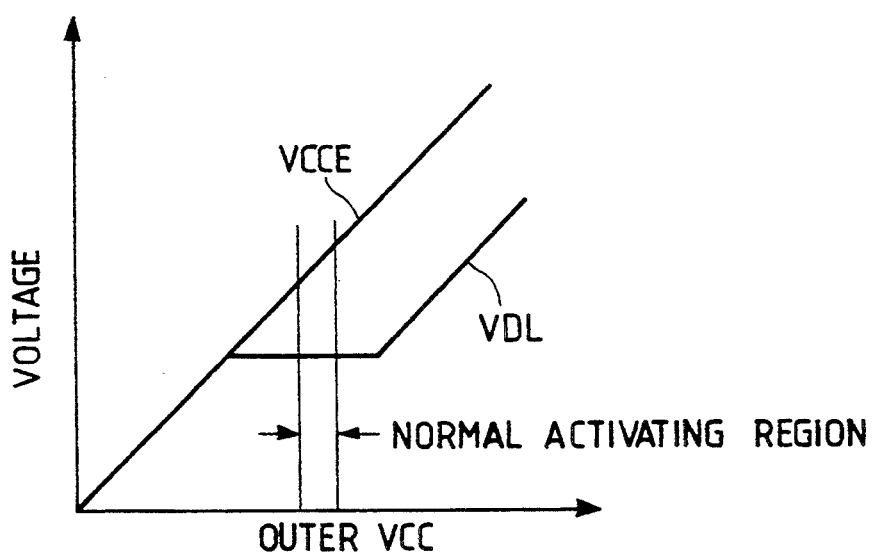
FIG. 18 is a view illustrating the characteristic of the power step-down circuit included in FIG. 17.

FIG. 18 is a view illustrating the characteristic of the power step-down circuit included in FIG. 17. The step-down circuit provides a constant voltage when given a supply voltage VCCE from the outside at or higher than a predetermined voltage level. When the supply voltage VCCE is raised still higher beyond a certain level, the stepped-down voltage is also raised correspondingly. It is within the constant voltage range obtained as above that the normal actuating region for the memory array is established.

There is a reason for allowing the stepped-down voltage VDL to go up in keeping with the increase of the supply voltage VCCE. That is, the rise in the stepped-down voltage VDL corresponds to the aging or burn-in test for applying stress to the memory array to ferret out initial failures.

Figure 19:
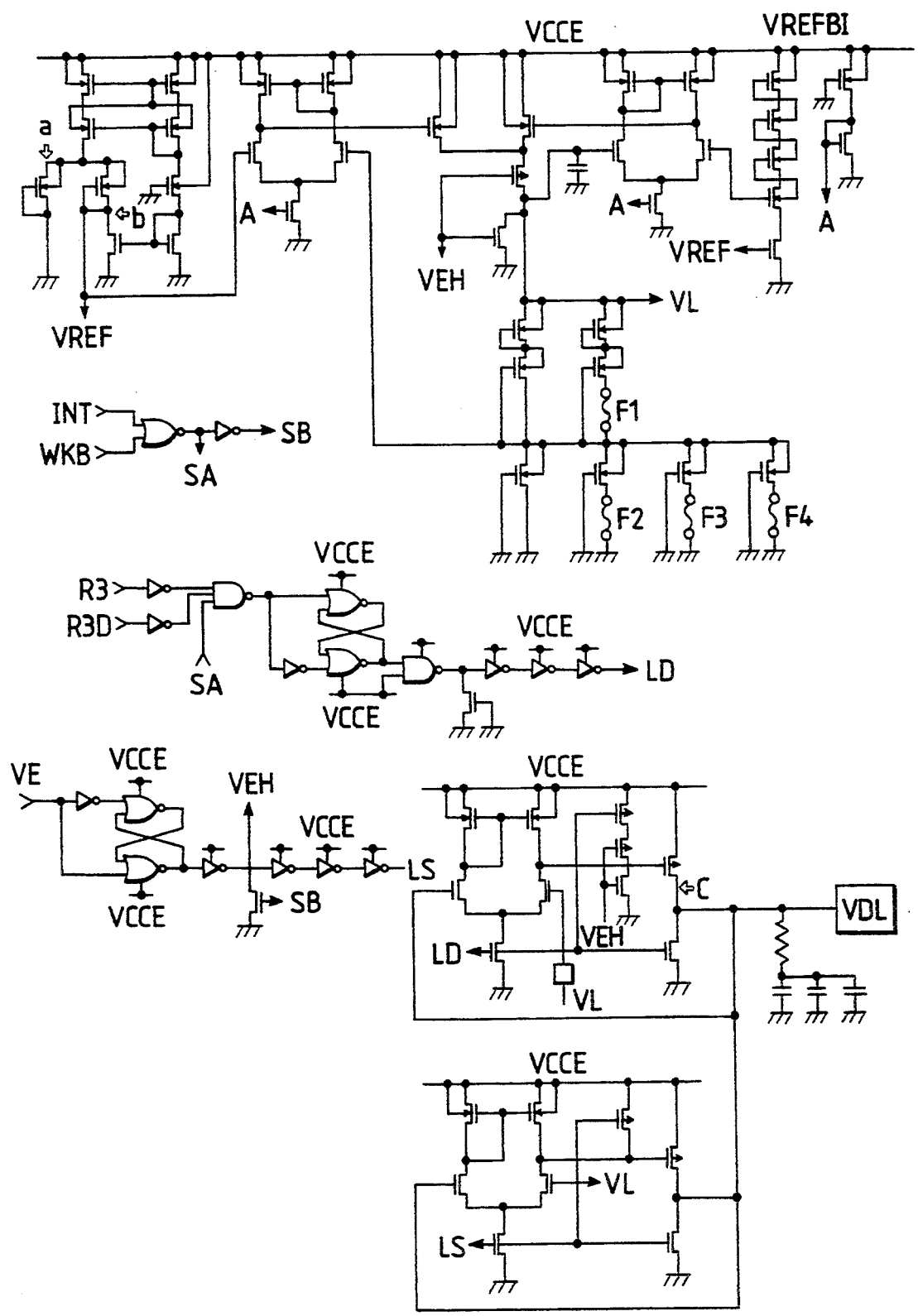
FIG. 19 is a typical circuit diagram of the power step-down circuit included in FIG. 17.

FIG. 19 is a typical circuit diagram of the power step-down circuit included in FIG. 17. In this diagram, a voltage VREF serves as a reference voltage that is output as the difference between the threshold voltages of two P-channel MOSFET's a and b. The reference voltage VREF is kept substantially constant regardless of the fluctuation of the supply voltage VCCE.

A voltage VL is a reference voltage obtained by having the reference voltage VREF amplified with an amplifier circuit by a predetermined factor, the resulting reference voltage VL corresponding to a desired array voltage. Fuse means F1 through F4 are provided to keep the reference voltage VL at the desired level even when the reference voltage VREF is changed because of the process-induced dispersion. A trimming circuit is furnished to blow any of the fuse means F1 through F4 for control over the amplification factor.

When the supply voltage VCCE is raised higher than a predetermined voltage level, i.e., when a stress voltage is provided for burn-in test purposes, a reference voltage VRFBI is output after being lowered by four stages from the threshold voltage VTH of the P-channel MOSFET with respect to the supply voltage VCCE. When the voltage VRFBI becomes higher than the voltage VL multiplied by a predetermined factor by the amplifier circuit, the voltage VL is replaced automatically by the stress voltage that behaves in keeping with the voltage VRFBI.

The voltage VDL is output by an impedance conversion buffer that provides a low-impedance power supply equal to the voltage VL by referring thereto. For reduced power dissipation, the impedance conversion buffer comprises an operating impedance conversion buffer and a standby impedance conversion buffer. The operating impedance conversion buffer is controlled by a signal LD and the standby impedance conversion buffer is controlled by a signal LS.

The signal LD is set to the high level upon receipt of the high level of a signal R3 when the signal RASB is brought Low. Bringing the signal LD High activates the operating impedance conversion buffer. In the standby state where the signal RASB is brought High, power dissipation is reduced by stopping the operating impedance conversion buffer with the signals R3 and R3D brought Low and with a signal SA brought High.

The signal LS is a dedicated test mode signal that is held High in normal mode where the signal VE is at the low level. At its high level, the signal LS causes the standby impedance conversion buffer to operate. In test mode where the signal VE is brought High, the signal LS is brought Low to stop the operation of the standby impedance conversion buffer. At the same time, a signal VEH is brought High to turn on the P-channel MOSFET indicated by an arrow c. This causes the internally stepped-down voltage VDL to be connected directly to the supply voltage VCCE. This test mode is also a mode in which the supply voltage VDL of the memory array is made equal to the supply voltage VCCE of the peripheral circuits.

The signal SA and a signal SB are generated using two signals: a signal INT brought High upon detection of the level of the supply voltage VCCE within a predetermined period of time after power-up, and a signal WKB brought High upon detection of the substrate potential. The signals SA and SB act as initialization signals that force the voltage VDL buffer (i.e., impedance conversion buffer) into the operating state when power is applied, thereby charging the potential necessary for the operation of the memory array.

Figure 20:
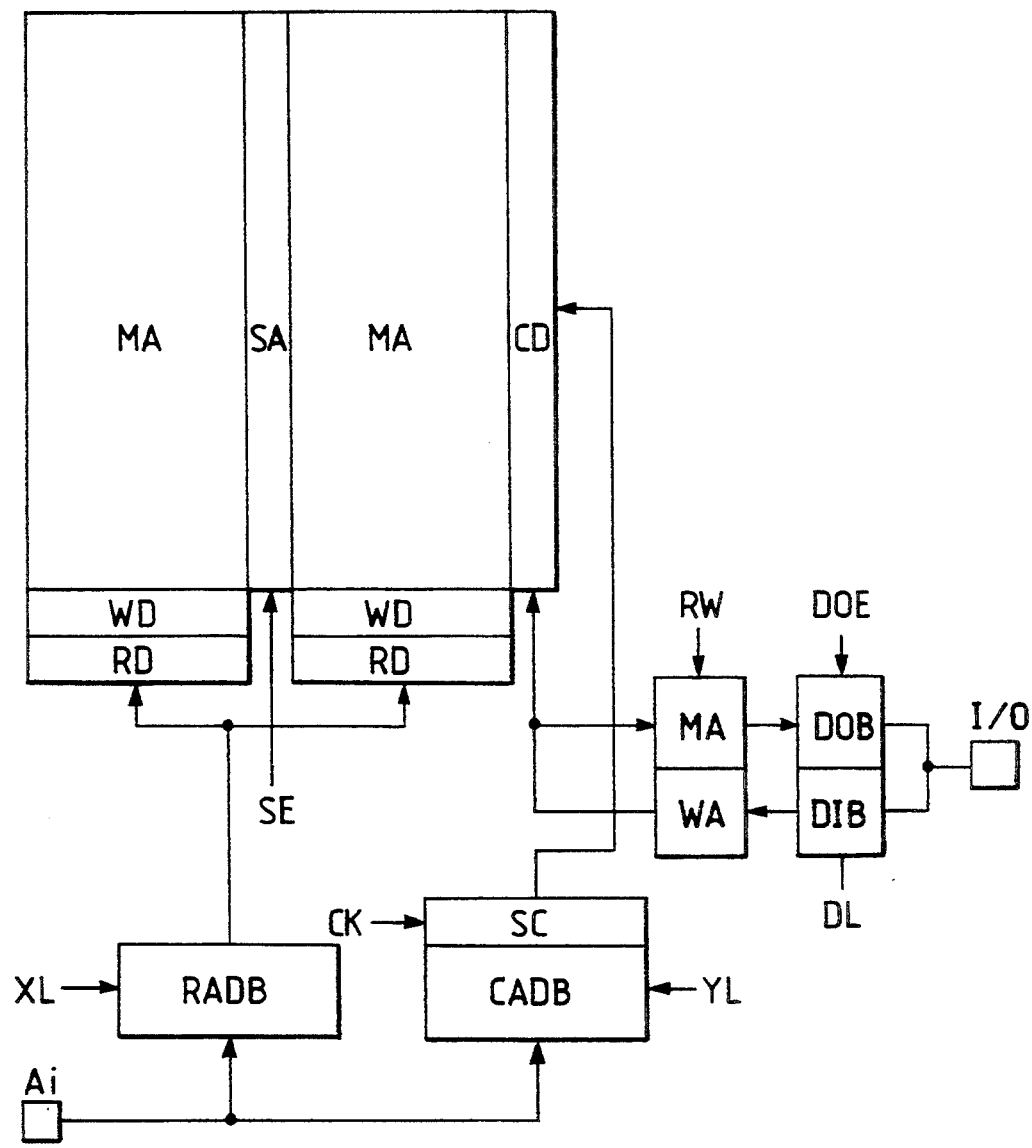
FIG. 20 is an overall block diagram of another dynamic RAM embodying the invention.

FIG. 20 is an overall block diagram of another dynamic RAM embodying the invention. In the example of FIG. 20, the number of memory cells connected to the bit and word lines is increased for higher circuit integration and lower power dissipation. In addition, the operating voltage of the memory array is lowered in the manner described. This requires allocating more time for selecting the memory cells and for reading data over the bit lines (i.e., longer access time).

In order to shorten the access time substantially, the example of FIG. 20 utilizes what is an intra-page serial access mode. In this mode, a clock generating circuit CLG receiving the control signals RASB, CASB, WEB and OEB outputs a row address buffer control signal XL, a column address buffer control signal YL, a sense amplifier driving signal SE, a read/write control signal RW, a data input buffer control signal DL and a data output buffer control signal DOE.

A serial clock signal CK is generated as per the toggle of the signal CASB in the intra-page serial access mode when the signal RASB is at the low level, but the invention is not limited to this. The serial clock signal CK thus generated increments a serial counter SC initialized by the output of a column address buffer CADB. This operation mode permits high-speed access because there is no need to effect address input from the outside during serial access.

In FIG. 20, reference characters RADB stand for a row address buffer, CADB for a column address buffer, MA for a memory array, SA for a sense amplifier, CD for a column decoder, RD for a row decoder, WD for a word driver, MA for a main amplifier, DOB for a data output buffer, DIB for a data input buffer, and WA for a write amplifier.

Figure 21:
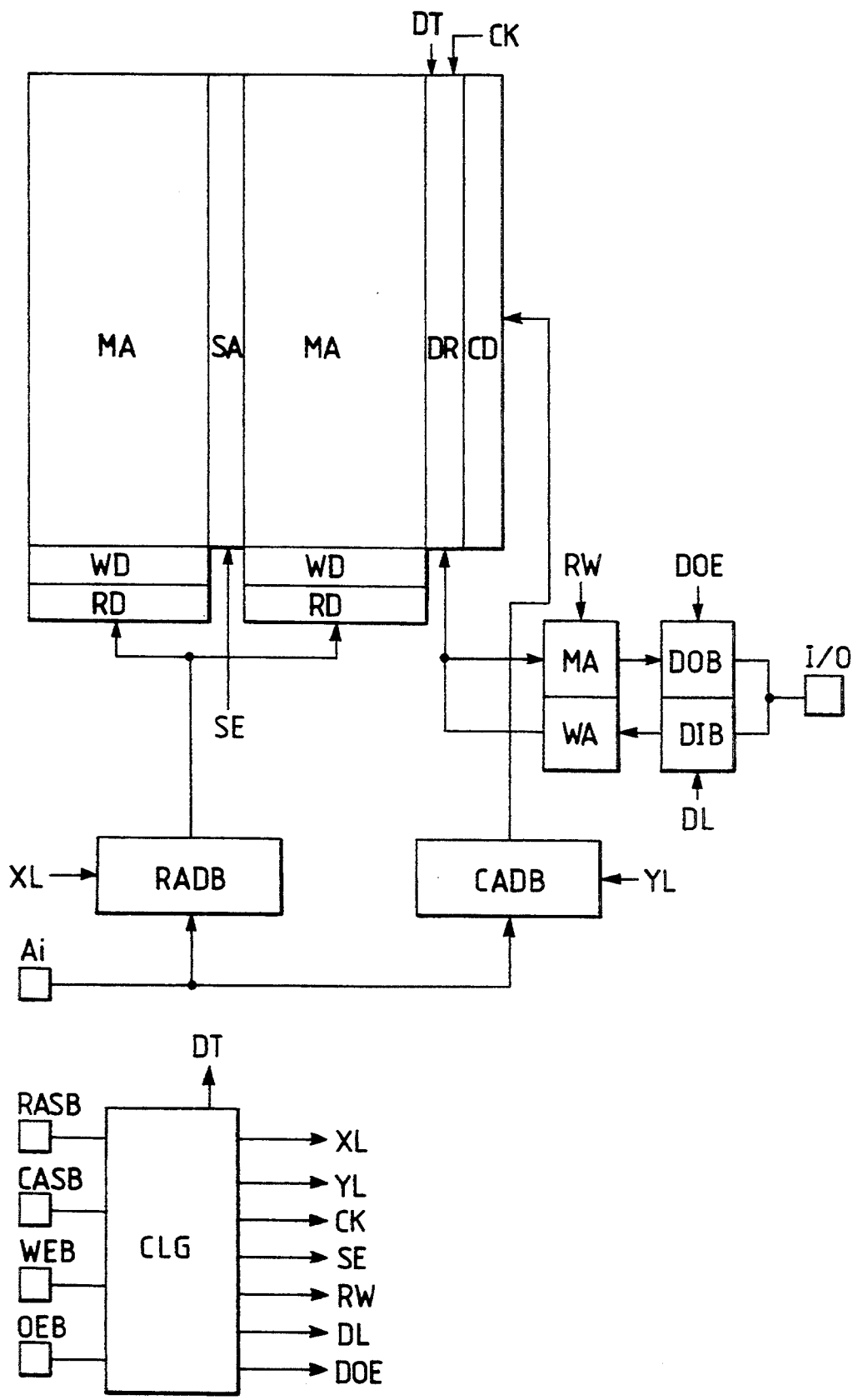
FIG. 21 is an overall block diagram of another dynamic RAM embodying the invention.

FIG. 21 is an overall block diagram of another dynamic RAM embodying the invention. The example of FIG. 21, a variation of the example of FIG. 20, includes a data register DR interposed between the column decoder CD and the memory array MA. The data register DR receives one page of data (one word line of data) amplified by the sense amplifier SA.

To provide the data register DR entails removing the serial counter SC. The amplifying operation of the sense amplifier SA started by the signal SE is followed by generation of a data transfer signal DT that causes one page of data to be transferred to the data register RD. Subsequent intra-page access is conducted at high speed with the data register DR used as a cache memory. If the data register DR has a shift register function, it permits high-speed serial access using the serial clock signal CK generated as per the toggle of the signal CASB.

Figure 22:
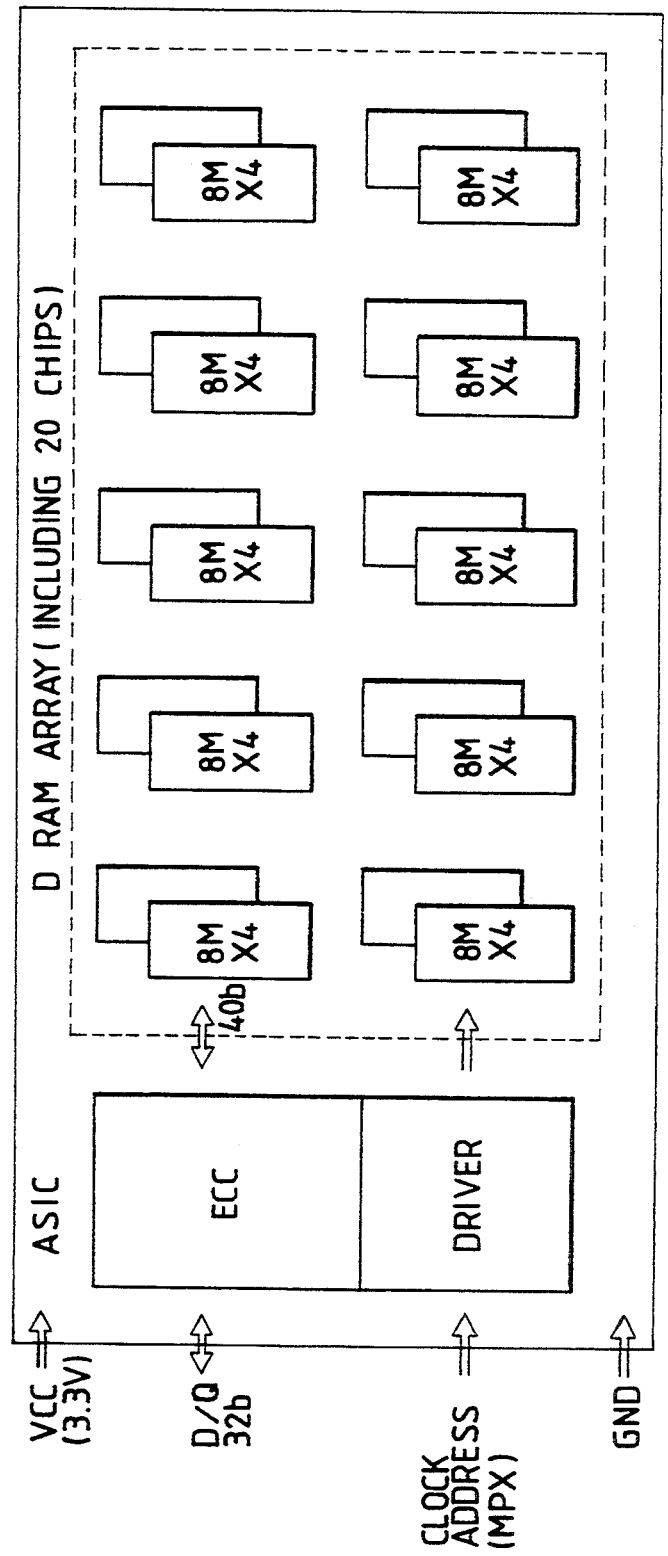
FIG. 22 is a schematic block diagram of a memory utilizing dynamic RAM's according to the invention.

FIG. 22 is a schematic block diagram of a memory utilizing dynamic RAM's according to the invention. Under the same design rules used for the 16-megabits dynamic RAM in the preceding example, the inventive dynamic RAM offers a degree of circuit integration which is about twice as high (with a chip area increase of about 25%). This provides for a dynamic RAM arrangement having a capacity of about 32 megabits.

The example of FIG. 22 involves a memory card comprising an ECC (error correcting code) chip and 20 dynamic RAM's. If the memory card size is the same, this example achieves a capacity twice as high as that of a setup composed of 16-megabits dynamic RAM's.

The use of the ECC chip allow potentially defective chips to be incorporated, which reduces the costs involved. The arrangement also provides sufficiently high levels of resistance to soft errors caused by a rays.

Figure 23:
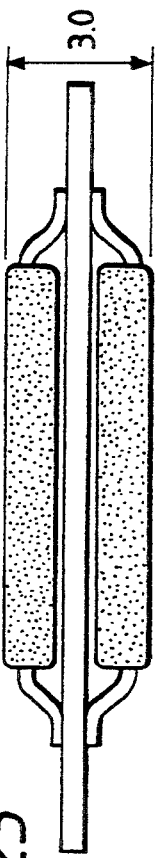
FIG. 23 is a sectional view of a dynamic RAM arrangement in the form of a memory card.

FIG. 23 is a sectional view of a dynamic RAM arrangement in the form of the memory card depicted in FIG. 22. The dynamic RAM's with a capacity of about 32 megabits each are contained in TSOP packages and mounted on both sides of the substrate to achieve a high degree of circuit integration.

Figure 24:
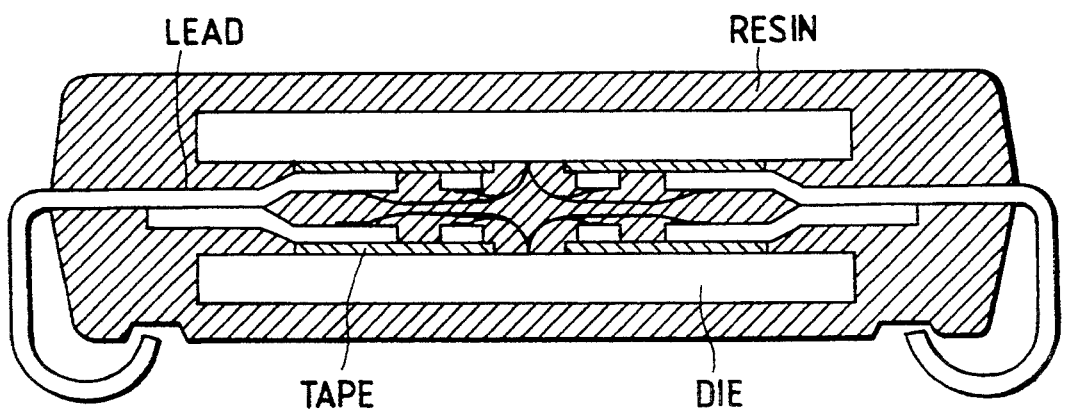
FIG. 24 is a sectional view of another dynamic RAM arrangement according to the invention.

FIG. 24 is a sectional view of another dynamic RAM arrangement according to the invention. This example comprises two semiconductor chips of dynamic RAM's with a capacity of about 32 megabits each which is incorporated face to face in an SOJ package using LOC techniques. The dynamic RAM arrangement thus made up constitutes a dynamic RAM having an apparent capacity of about 64 megabits subject to the design rules for 16-megabits RAM's.

Figure 25:
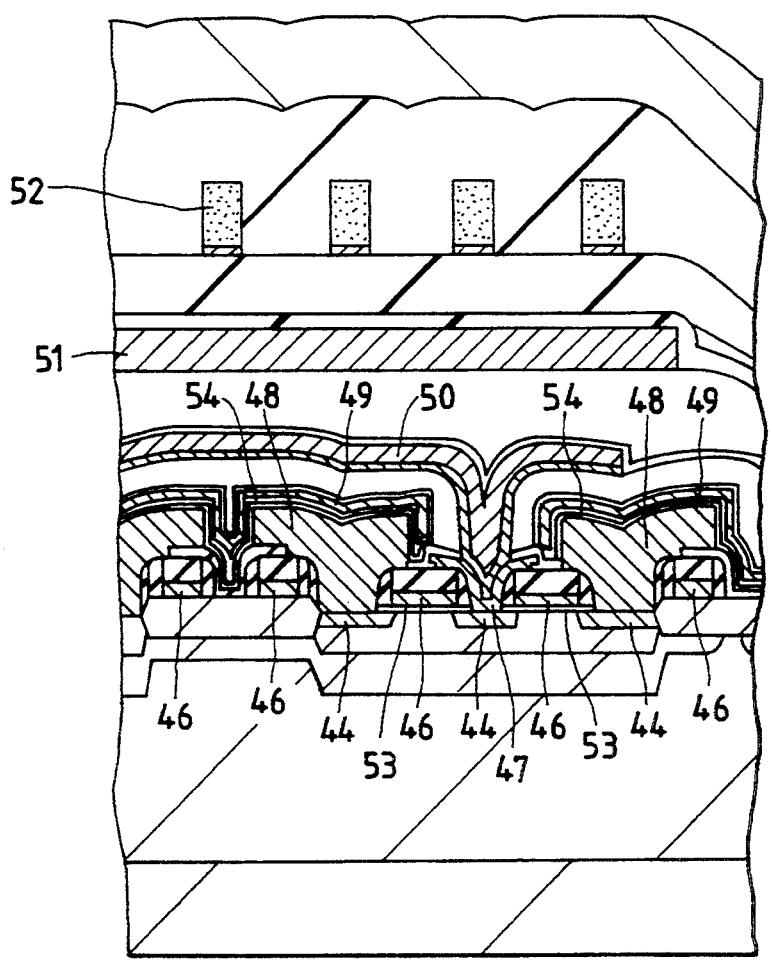
FIG. 25 is a device structure sectional view of memory cells in a dynamic RAM according to the invention.

FIG. 25 is a device structure sectional view of memory cells in a dynamic RAM according to the invention. In FIG. 25, reference numeral 46 represents word lines made of a polysilicon layer; 48 denotes accumulating electrodes constituting capacitors CS; 54 stands for an insulating film that acts as a dielectric for the capacitors CS; 49 indicates plate electrodes supplied with the plate voltage VPL mentioned earlier; 50 points to bit lines made of polycide; and 52 represents an aluminum layer constituting word line shunts.

The memory cells are built into a layered structure. The insulating film 54 is usually composed of $SiO_2$ or $Si_3N_4$. Alternatively, the insulating film 54 may be an enhanced dielectric film made illustratively of $Ta_2O_3$ for boosting the capacitance of the capacitors CS. The purpose in adopting the dielectric film is to enhance the read voltage that tends to drop relatively in the event of an increase in the bit line capacitance CB. Specifically the bit line capacitance CB is increased when the size of capacitors CS is reduced or when a large number of memory cells are connected to each bit line for higher circuit integration. If the enhanced dielectric film is employed as the insulating film, the memory cell structure is simplified.

The capacitors for causing the amplifier MOSFET's Q4 and Q5 to act initially based on capacitive coupling constitute, but are not limited to, the same structure as that of the capacitors CS making up part of the memory cells. In that case, the amplifier MOSFET's Q4 and Q5 may take on the same structure as that of those MOSFET's QM for address selection which constitute part of the memory cells. The amplifier MOSFET's Q4 and Q5 may be made larger in size than the memory cells in order to increase the gain of amplification.

As described, the MOSFET QM and the capacitor CS having structures equivalent to those of the memory cells are used to constitute the amplifier MOSFET Q4 and the capacitor to be furnished at the source. Thus, simply adding an MOSFET corresponding to the power switch or separating MOSFET Q8 makes it possible with relative ease to build in sense amplifiers in keeping with the pitch of the bit lines. In that case, a large capacitance value is obtained if the capacitors are made of an enhanced dielectric film. This, in turn, allows the capacitive coupling of the sense amplifiers to produce highly amplified signals.

The major benefits of the above-described dynamic RAM examples embodying the invention are as follows:

(1) A high degree of circuit integration is accomplished by use of the sense amplifiers compensating for the dispersion of characteristics for paired MOSFET's, with the parasitic capacitance of the bit lines made at least 20 times the capacitance of memory cells.

(2) Power dissipation is reduced by a novel setup in which each bit line connected to the sense amplifier is bisected by a switch MOSFET. When a word line intersecting the bit line outside the sense amplifier relative to the switch MOSFET is selected in one of two memory arrays, the word line intersecting the bit line on the sense amplifier side relative to the switch MOSFET is selected in the other memory array. This setup contributes to lowering power dissipation.

(3) Power dissipation is further reduced by another setup in which a plurality of memory arrays constitute one memory array set. There are switch MOSFET's interconnecting common source lines to which sense amplifiers are connected. In each set of the multiple memory arrays, the word lines are selected one at a time in the refresh mode. In that mode, the switch MOSFET's interconnecting the common source lines are turned on to start the amplifying operation of each sense amplifier. With the switch MOSFET turned off, the power switch MOSFET of a given sense amplifier is turned on to effect its amplifying operation. This setup also contributes to lowering power dissipation.

(4) A dynamic RAM having a capacity of about 32 megabits is acquired if the feature described in (1) above is taken advantage of in accordance with the unmodified design rules for 16-megabits dynamic RAM's.

(5) A sense amplifier of high sensitivity is obtained as follows: a delay time is provided between two amplifier MOSFET's of two different conductivity types constituting one CMOS sense amplifier. The delay time is reflected in the dispersion of the threshold voltage for the MOSFET that acts first, as well as in the input offset of the sense amplifier. A first and a second switch MOSFET are furnished between the gate and the input terminal of the sense amplifier, and a third and a fourth switch MOSFET are provided between the gate and the common source side of the first-acting MOSFET. The first and the second switch MOSFET's are turned off and the third and the fourth switch MOSFET's are turned on to apply a pre-charge voltage to the common source side of the first-acting amplifier MOSFET. The pre-charge voltage is the sum of half the operating voltage and the threshold voltages of the first- and second-acting amplifier MOSFET's. The bit line is pre-charged in this manner. Then, the third and the fourth switch MOSFET's are turned off, the first and the second switch MOSFET's are turned on, and one of the two input terminals is fed with a very low potential with reference to the pre-charge voltage. This activates the first-acting amplifier MOSFET for amplification. Thereafter, the second-acting amplifier MOSFET of the other conductivity type constituting part of the CMOS sense amplifier is activated. In this manner, the offset of the sense amplifier is compensated so that the amplifier will have a higher level of sensitivity.

(6) A sense amplifier of high sensitivity is also obtained as follows: a delay time is provided between two amplifier MOSFET's of two different conductivity types constituting one CMOS sense amplifier. The delay time is reflected in the dispersion of the threshold voltage for the MOSFET that acts first, as well as in the input offset of the sense amplifier. A switch MOSFET is furnished between bit lines. During initial amplification of the first-acting amplifier MOSFET based on capacitive coupling, the bit lines are disconnected from the sense amplifier by the switch MOSFET. This allows the amplifying operation based on capacitive coupling to be implemented with a small capacitive, whereby the offset of the sense amplifier is compensated. The resulting sense amplifier offers a high level of sensitivity.

(7) The chip size is reduced using sense amplifiers with their input offset compensated as described. With such sense amplifiers in use, the number of memory cells connected to each bit line is increased so that the rate of memory occupancy in the semiconductor chip is increased significantly. The size of the semiconductor chip is thus reduced correspondingly for the unit memory capacity.

(8) The inventive dynamic RAM permits write and read operations thereto and therefrom at high speed. Use of the sense amplifiers with their input offset compensated as described allows the dynamic RAM substantially to increase the level of the signal read onto the bit line. The higher the signal level, the quicker the access to the dynamic RAM made possible.

Figure 26:
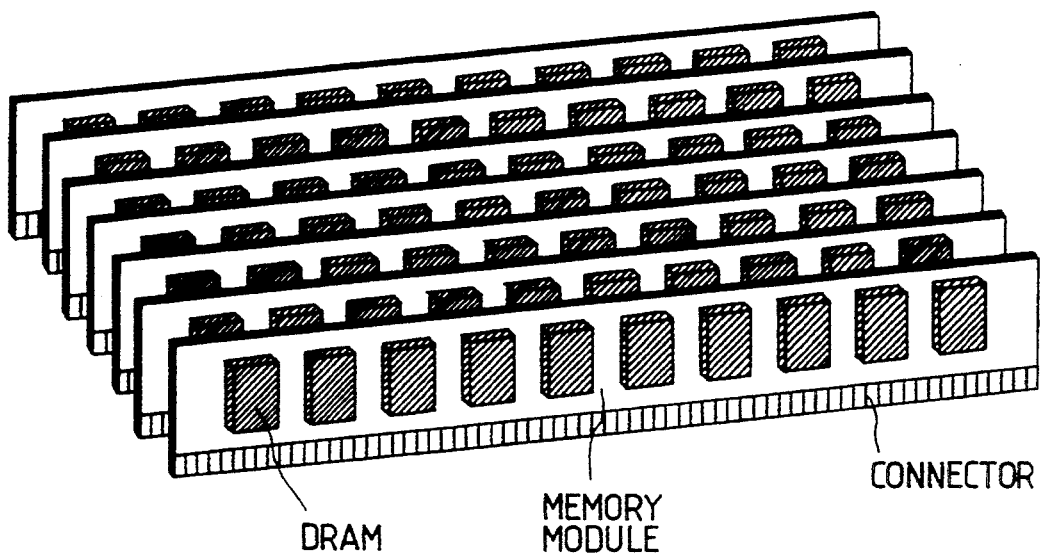
FIG. 26 is a partial schematic view of a memory board comprising dynamic RAM's according to the invention.

FIG. 26 is a partial schematic view of a memory board comprising dynamic RAM's according to the invention for use in a computer system. The memory board is composed of a plurality of memory modules. Each memory module comprises a plurality of packaged DRAM's according to the invention. These DRAM's are connected to the wiring of the memory modules.

Connectors of the memory modules connect the inventive DRAM's to the address or data bus of the computer system. The memory module connection is accomplished by plugging the memory module connectors into slots of the memory board in the memory accommodating portion of the computer system. The memory capacity of the computer system or the like is determined by the number of DRAM's mounted on the memory board, i.e., DRAM's incorporated in the memory modules.

Figure 27:
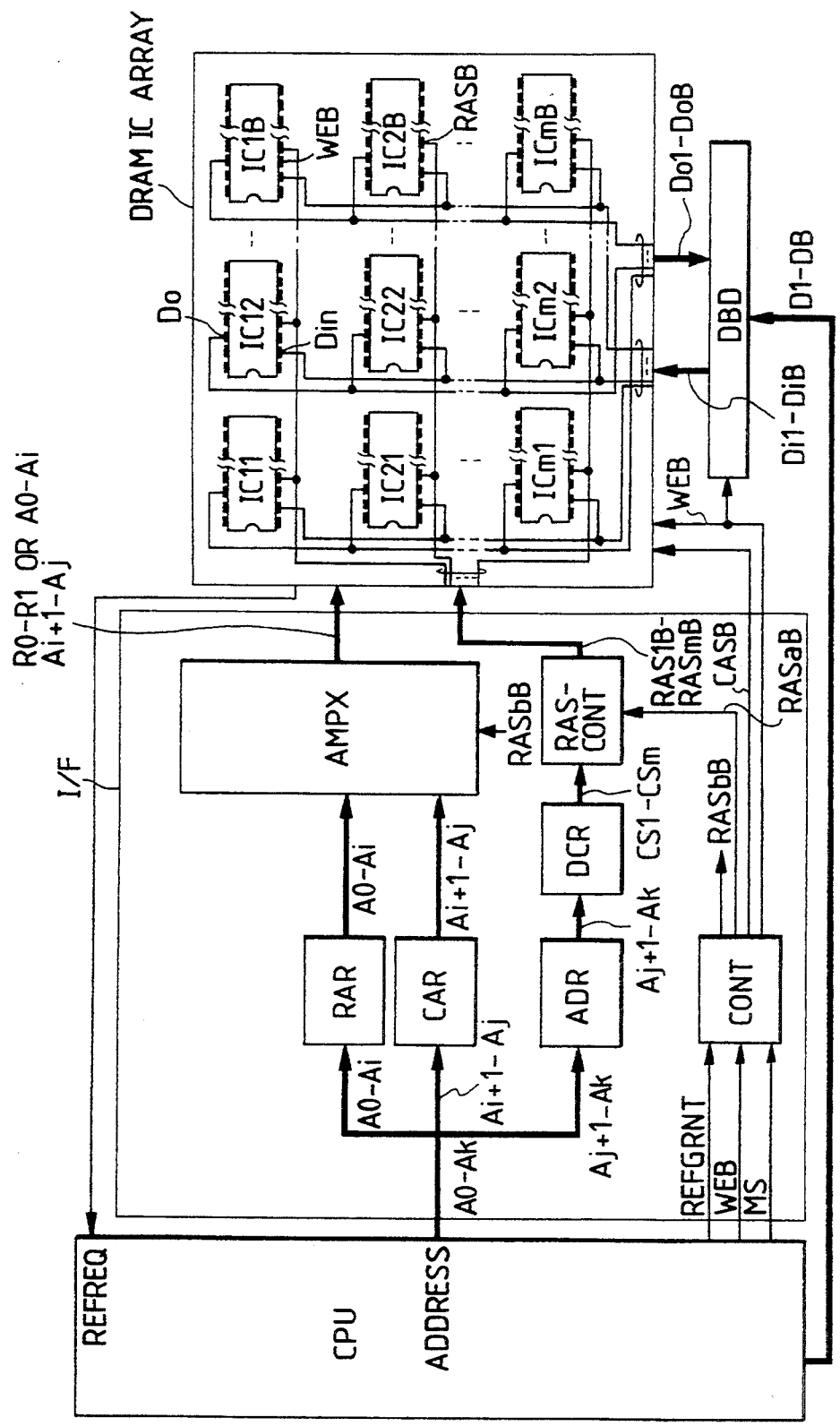
FIG. 27 is a partial schematic view of a DRAM system comprising dynamic RAM's according to the invention.

FIG. 27 is a partial schematic view of a DRAM system comprising dynamic RAM's according to the invention. This system comprises a DRAM IC array made of the inventive DRAM's described, a CPU (central processing unit), and an interface circuit I/F for interfacing the components to the CPU.

Below is a description of I/O signals exchanged between the DRAM system and the CPU. An address signal A0–Ak generated by the CPU is used to select an address in the DRAM's. A refresh instruction signal REFGRNT is a control signal that causes the stored data in the DRAM's to be refreshed. A write enable signal WEB is a control signal that causes data to be written and read to and from the DRAM's. A memory start signal MS starts a store operation on the DRAM's when generated. I/O data D1–DB is exchanged over the data bus between the CPU and the DRAM's. A refresh request signal REFREQ is a control signal that requests refreshing of the stored data in the DRAM's.

In the interface circuit I/F, a row address receiver RAR receives an address signal part A0–Ai out of the address signal A0–Ak sent from the CPU, and converts the received address signal part into an address signal whose timing complies with the operation of the DRAM according to the invention. A column address receiver CAR receives an address signal part Ai+1 through Aj out of the address signal A0–Ak, and converts the received address signal part into an address whose timing also complies with the operation of the inventive DRAM. An address receiver ADR receives an address signal part Aj+1 through Ak out of the address signal A0–Ak, and converts the received address signal part into an address signal whose timing also complies with the operation of the inventive DRAM.

A decoder DCR outputs a chip select control signal (CS1–CSm) for selecting a DRAM chip of the invention. A RAS control circuit RAS-CONT outputs a chip select signal and a row address receipt signal at the timing complying with the operation of the inventive DRAM. An address multiplexer ADMPX multiplexes the address signal parts A0–Ai and Ai+1 through Aj on a time series basis for output to the DRAM. A data bus driver DBD receives the write enable signal WEB and switches data input and output between the CPU and the DRAM accordingly. Another control circuit CONT outputs signals to control the address multiplexer ADMPX, the RAS control circuit RAS-CONT, the data bus driver DBD and the DRAM.

The address signal works in the DRAM system as follows: the address signal A0–Ak output by the CPU is first divided internally into two functional parts, A0–Aj and Aj+1 through Ak. The address signal part A0–Aj is used as the address signal addressing the rows and columns making up the memory matrix of each DRAM chip according to the invention. The address signal part A0–Ai is designed to select a row in the DRAM IC chip array, and the address signal part Ai+1 through Aj is intended to select a column in the same IC chip array.

The circuits in the DRAM system operate as follows: the address signal parts A0–Ai and Ak+1 through Aj are sent to the address multiplexer ADMPX via the row address receiver RAR and column address receiver CAR, respectively. When a signal RASbB reaches a predetermined level, the address multiplexer ADMPX generates a row address signal part A0–Ai for output to the address terminals of the DRAM. At this point, a column address signal part Ai+1 through Aj is prevented from being sent out from the address multiplexer ADMPX.

When the signal RASbB is inverted in level, the address multiplexer ADMPX sends out the column address signal part Ai+1 through Aj for output to the address terminals. At this point, the row address signal part A0–Ai is prevented from leaving the address multiplexer ADMPX.

In this manner, the address signal parts A0–Ai and Ai+1 through Aj are applied to the address terminals of the DRAM on a time series basis. The chip select signal Aj+1 through Ak is decoded by the decoder DCR primarily for selecting a DRAM chip. The decoded chip select signal is then converted to the chip select control signal CS1–CSm and used as a chip select signal and a row address receipt signal.

An address of a given row in the DRAM chip is set as follows: the row address signal part A0–Ai is applied to all address terminals of all DRAM IC chips. Suppose that as many as B IC's at the top are selected when one of the signals RAS1B through RASmB (e.g., RAS1B) reaches a predetermined level. In that case, the row address part A0–Ai is applied before the signal RAS1B to the row addresses of the memory matrix array inside the IC chips (IC11, 1C12, . . . , IC1B). The row address part A0–Ai is put before the signal RAS1B because a signal other than the row address signal could be inadvertently received if the signal order were reversed.

The column address signal part Ai+1 through Aj is then applied to all address terminals of all DRAM chips. When the signal CASB, delayed relative to the signal RAS1B, reaches a predetermined level, the column address signal part Ai+1 through Aj is input to the column addresses of the memory matrix array in the B IC chips at the top. The column address signal part Ai+1 through Aj is input before the signal CASB for the same reason as described above. The signal CASB is used to indicate whether the row address signal part A0–Ai or the column address signal part Ai+1 through Aj is being sent.

The operations of the signals described above combine to determine the address in the B chips at the top of DRAM according to the invention. The DRAM IC's other than the top B chips are not selected because the level of the signal RAS2B–RASmB is opposite to that of the signal RAS1B.

Below is a description of how data is written to and read from the addresses determined as described above. Either a data write operation or a data read operation is selected depending on the level of the signal WEB being High or Low. The data write operation is carried out by writing data DI1–DIB from the CPU to the established address while the signal WEB remains at the predetermined level.

The data read operation is conducted by outputting B bits of data Do1–DoB from the address at which data was already written when the signal WEB was at the opposite level. The control circuit CONT receives such command signals as REFGRNT, WEB and MS from the CPU, and outputs the signals CASB, RASaB, RASbB and WEB. The control signals thus which are output in this manner work as follows: the signal CASB is used to indicate whether the row address signal part A0–Ai or the column address signal part Ai+1 through Aj is being sent to each DRAM chip. The signal CASB also acts to let IC chip column address signals be received.

The signal RASaB allows the signal CS1–CSm to be fed at the proper timing to the IC chip array in the DRAM. The signal WEB is used to determine whether data is to be written to or read from a given memory cell in the DRAM IC chip. The signal RASbB is a switching timing signal that causes the address multiplexer ADMPX to convert the row address signal part A0–Ai and column address signal part Ai+1 through Aj into a time series multiplexed signal. The signal RASaB is outputted at the timing after the level of the signal RASbB is switched so that the row address signal part A0–Ai is outputted from the address multiplexer ADMPX and thereafter one RASB signal (RASB-1–RASBm) is selectively provided.

The relations between the signal WEB and the data bus driver DBD will now be described. The signal WEB is output by the control circuit CONT and applied to the DRAM and to the data bus driver DBD. Illustratively, when the signal WEB is at the high level, read mode is selected. In this mode, data is output from the DRAM and sent to the CPU via the data bus driver DBD. At this point, the input data is prevented by the signal WEB from being input to the DRAM. When the signal WEB is at the low level, write mode is selected. In write mode, the CPU applies input data to the data input terminal of the DRAM via the data bus driver DBD so that the data will be written to the designated address. In this case, the data output from the DRAM is prevented by the signal WEB from being output from the data bus driver DBD.

Figure 28:
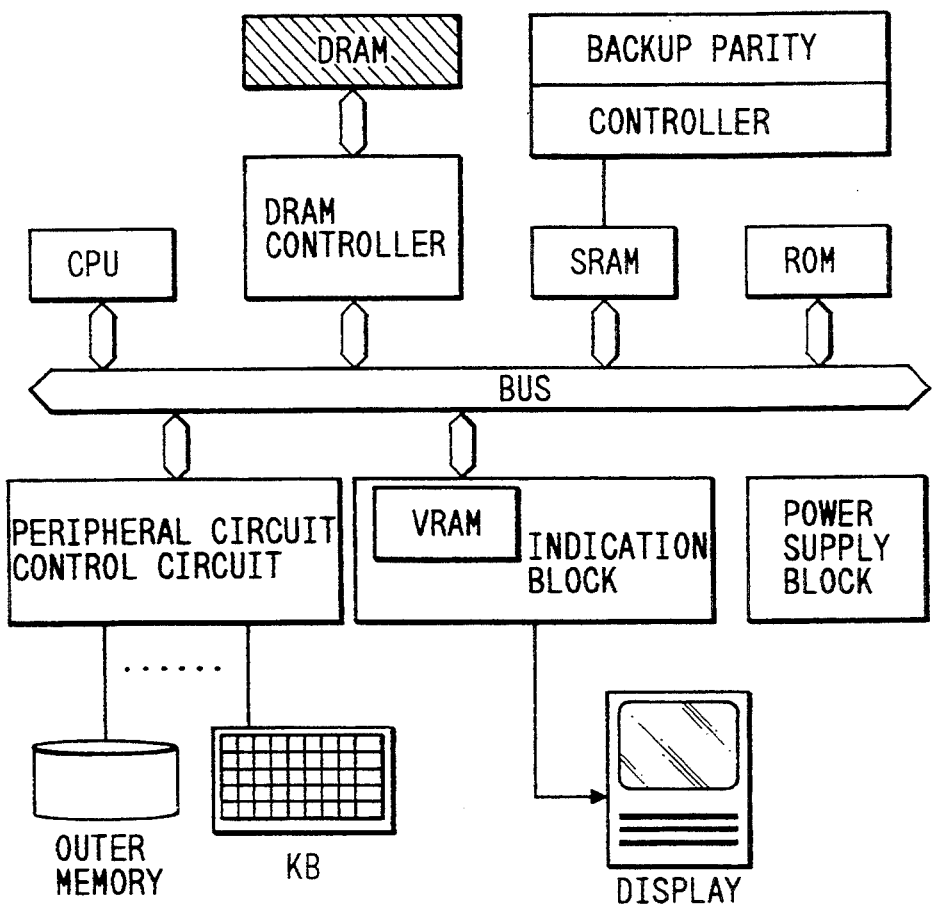
FIG. 28 is a partial schematic view of a computer system comprising dynamic RAM's according to the invention.

FIG. 28 is a partial schematic view of a computer system comprising dynamic RAM's according to the invention. This computer system comprises a bus, a CPU (central processing unit), a peripheral circuit controller, a DRAM, a DRAM controller, an SRAM working as a backup memory, a backup parity block, a backup parity controller, a program-storing ROM and a display block.

The peripheral circuit controller is connected to an external memory and a keyboard KB. The display block includes a video RAM (VRAM). Connected to a display unit acting as an output device, the display block displays information stored in the VRAM. A power supply block is provided to power the circuits inside the computer system. The CPU generates control signals to control the various memories in terms of their operation timing. Although this example shows the invention as applied to the DRAM acting as the main memory, the invention may also be applied to the random access block of the VRAM if the VRAM of the display block is a multiple port VRAM.

Figure 29:
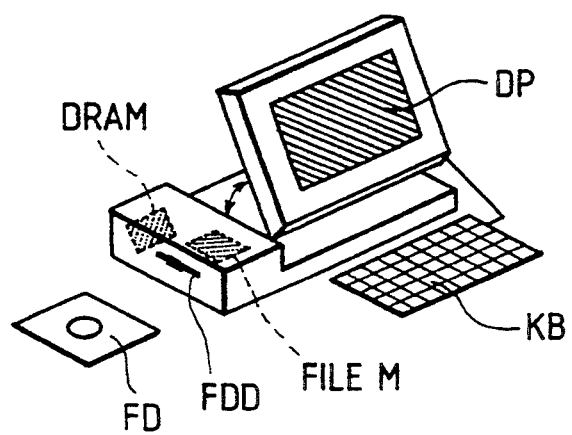
FIG. 29 is an external view of a personal computer system incorporating a dynamic RAM according to the invention.

FIG. 29 is an external view of a personal computer system incorporating the inventive DRAM as its main memory. The computer system includes a floppy disc drive FDD, a file memory FILEM composed of the DRAM as the main memory, and an SRAM backed up by battery. The input block comprises a keyboard KB and a display unit DP. A floppy disc FD is inserted in the floppy disc drive FDD. With these components in place, the system operates as a desk-top type personal computer that stores information on the floppy disc FD (used as software) and in the file memory FILEM (as hardware). Although the example of FIG. 29 to which the invention is applied is a desk-top type personal computer, the invention may also be applied to a notebook type personal computer. Furthermore, the illustration of the floppy disc drive as an auxiliary function in this figure is not intended to limit the invention.

Figure 30:
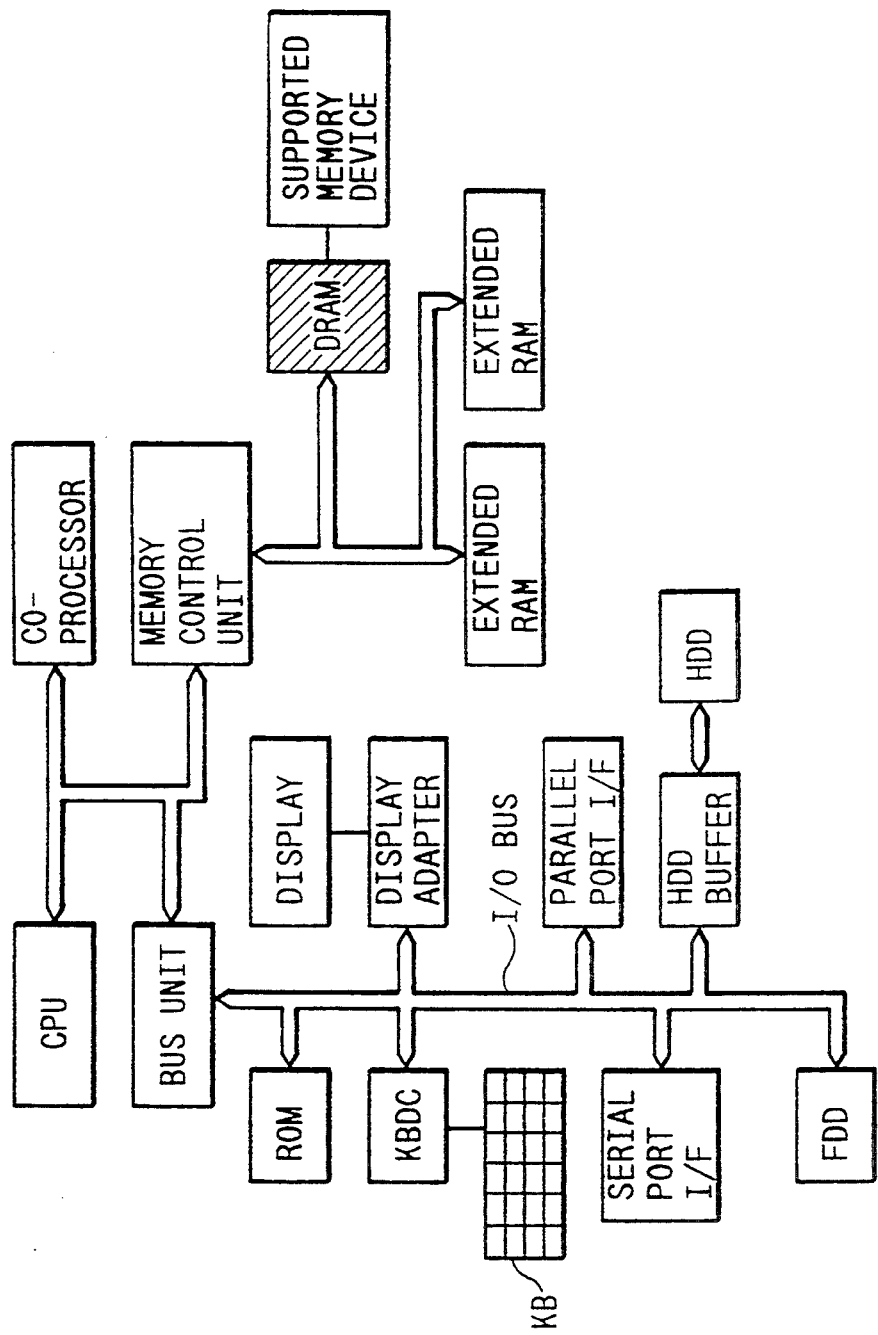
FIG. 30 is a function block diagram of a personal computer system incorporating a dynamic RAM according to the invention.

FIG. 30 is a function block diagram of a personal computer system incorporating the inventive DRAM as its main memory. This personal computer comprises a CPU (central processing unit) acting as a data processor, an I/O bus built in the system, a bus unit, a memory control unit for access to such high-speed memories as the main and extended memories, the DRAM acting as the main memory, a ROM storing basic control programs, and a keyboard controller KBDC to which a keyboard is connected.

A display adapter is connected to the I/O bus. A display unit is attached to the display adapter. The I/O bus is also connected to a parallel port interface, a floppy disc drive FDD, and an HDD buffer controller to which a hard disc drive HDD is attached.

Extended RAM's as well as the DRAM acting as the main memory are connected via the bus to the memory control unit. This personal computer system works as follows: when power is applied and the system is started, the CPU first gains access via the I/O bus to the ROM for initial diagnosis and initialization. Then the system program is loaded from the auxiliary memory into the DRAM, which is the main memory.

The CPU acts to gain access to the HDD controller via the I/O bus. With the system program loaded, the CPU performs its processing according to what is requested by the user. The user proceeds with I/O operations by use of the keyboard controller KBDC and the display adapter. Where necessary, the user may utilize I/O devices connected to the parallel and serial port interfaces. If the DRAM used as the main memory of the system fails to provide sufficient memory capacity, extended RAM's may be used to fill the gap. The hard disc drive HDD may be replaced by a flash file based on a flash memory. The DRAM according to the invention is not limited to being used as the main memory; it may also be employed as an extended RAM or as an auxiliary memory.

When the inventive DRAM is incorporated in an information processing system such as the one discussed above, the system can be reduced in size and enhanced in performance thanks to the diverse features of the DRAM: high degree of circuit integration, mass storage capacity, high-speed operation and low power dissipation.

Although the description above contains many specifics, these should not be construed as limiting the scope of the invention, but instead as merely providing illustrations of some of the presently preferred embodiments of this invention. For example, the layout of the dynamic RAM may be varied as needed. This is made possible because the number of sense amplifiers and that of memory cell capacitors connected to the bit lines may be varied depending on the performance of the sense amplifiers and on the capacitance value of the capacitors. Furthermore, the circuitry that compensates for the dispersion of threshold voltages for paired MOSFET's in the sense amplifiers may be implemented in diverse forms.

This invention is applied extensively to DRAM's and to information processing systems incorporating them. When the basic layout of the DRAM is set up as described above, the peripheral circuits thereof may be arranged in various forms. The input and output circuits are located in the middle of the chip and are connected using LOC techniques.

In addition to the DRAM's of mass storage as described, the invention may also be applied to various semiconductor integrated circuit devices made of various combinations of large-scale logic gate circuits and memory circuits. Although the preceding description of the invention has centered primarily on the mass-storage DRAM, which happens to be the inventors' specialty, the invention is not limited to DRAMs. The invention may also be applied to other memory circuits such as ROM's requiring sense amplifiers of high sensitivity.

To recapitulate what has been described, the major benefits of the invention are as follows: a high degree of circuit integration is accomplished by use of the sense amplifiers compensating for the dispersion of characteristics for paired MOSFET's, with the parasitic capacitance of bit lines made at least 20 times the capacitance of memory cells.

Power dissipation is reduced by a novel setup in which each bit line connected to the sense amplifier is bisected by a switch MOSFET. When a word line intersecting the bit line outside the sense amplifier relative to the switch MOSFET is selected in one of two memory arrays, the word line intersecting the bit line on the sense amplifier side relative to the switch MOSFET is selected in the other memory array. This setup contributes to lowering power dissipation.

Power dissipation is further reduced by another setup in which a plurality of memory arrays constitute one memory array set. There are switch MOSFET's interconnecting common source lines to which sense amplifiers are connected. In each set of the multiple memory arrays, the word lines are selected one at a time in refresh mode. In that mode, the switch MOSFET's interconnecting the common source lines are turned on to start the amplifying operation of each sense amplifier. With the switch MOSFET turned off, the power switch MOSFET of a given sense amplifier is turned on to effect its amplifying operation. This setup also contributes to lowering power dissipation.

Where information processing systems use as their memory the dynamic RAM of the above-described type, their performance is significantly enhanced while their sizes are reduced.

Furthermore, a sense amplifier of high sensitivity is obtained as follows: a delay time is provided between two amplifier MOSFET's of two different conductivity types constituting one CMOS sense amplifier. The delay time is reflected in the dispersion of the threshold voltage for the MOSFET that acts first as well as in the input offset of the sense amplifier. A first and a second switch MOSFET are furnished between the gate and the input terminal of the sense amplifier, and a third and a fourth switch MOSFET are provided between the gate and the common source side of the first-acting MOSFET. The first and the second switch MOSFET's are turned off and the third and the fourth switch MOSFET's are turned on to apply a pre-charge voltage to the common source side of the first-acting amplifier MOSFET. The pre-charge voltage is the sum of half the operating voltage and the threshold voltages of the first- and second-acting amplifier MOSFET's. The bit line is pre-charged in this manner. Then, the third and the fourth switch MOSFET's are turned off, the first and the second switch MOSFET's are turned on, and one of the two input terminals is fed with a very low potential with reference to the pre-charge voltage. This activates the first-acting amplifier MOSFET for amplification. Thereafter, the second-acting amplifier MOSFET of the other conductivity type constituting part of the CMOS sense amplifier is activated. In this manner, the offset of the sense amplifier is compensated so that the amplifier will have a higher level of sensitivity.

A sense amplifier of high sensitivity is also obtained as follows: a delay time is provided between two amplifier MOSFET's of two different conductivity types constituting one CMOS sense amplifier. The delay time is reflected in the dispersion of the threshold voltage for the MOSFET that acts first as well as in the input offset of the sense amplifier. A switch MOSFET is furnished between bit lines. During initial amplification of the first-acting amplifier MOSFET based on capacitive coupling, the bit lines are disconnected from the sense amplifier by the switch MOSFET. This allows the amplifying operation based on capacitive coupling to be implemented with a small capacitance, whereby the offset of the sense amplifier is compensated. The resulting sense amplifier offers a high level of sensitivity.

What is claimed is:

1. A dynamic RAM comprising a pair of complementary bit lines, a plurality of dynamic memory cells connected to said pair of complementary bit lines, and a sense amplifier connected to said pair of complementary bit lines for detecting the potential difference between said pair of complementary bit lines;

wherein said sense amplifier includes a pair of MOSFETs connected respectively to said pair of complementary bit lines, and wherein said dynamic RAM further includes compensating means for compensating for the threshold difference between said pair of MOSFETs, wherein said pair of MOSFETs comprise:
   a first MOSFET of a first conductivity type having a source-drain path and a gate, one end of said source-drain path being connected to one of said pair of complementary bit lines; and
   a second MOSFET of said first conductivity type having a source-drain path and a gate, one end of said source-drain path being connected to the other complementary bit line; and wherein said sense amplifier comprises:
- a first switch MOSFET for connecting said one complementary bit line to said gate of said second MOSFET;
- a second switch MOSFET for connecting said other complementary bit line to said gate of said first MOSFET;
- a third switch MOSFET for connecting the other end of said source-drain path of said first MOSFET to said gate of said first MOSFET;
- a fourth switch MOSFET for connecting the other end of said source-drain path of said second MOSFET to said gate of said second MOSFET;
- a third MOSFET of a second conductivity type having a source-drain path and a gate, one end of said source-drain path being connected to said other complementary bit line, said gate being connected to said one complementary bit line;
- a fourth MOSFET of said second conductivity type having a source-drain path and gate, one end of said source-drain path being connected to said one complementary bit line, said gate being connected to said other complementary bit line;
- a power switch MOSFET of said first conductivity type connected to the other end of said source-drain path of said first MOSFET and to the other end of said source-drain path of said second MOSFET, said power MOSFET of said first conductivity type applying a first voltage to the other end of said source-drain path of said first MOSFET and to the other end of said source-drain path of said second MOSFET;
- a power switch MOSFET of said second conductivity type connected to the other end of said source-drain path of said third MOSFET and to the other end of said source-drain path of said fourth MOSFET, said power MOSFET of said second conductivity type applying a second voltage to the other end of said source-drain path of said third MOSFET and to the other end of said source-drain path of said fourth MOSFET; and
- a pre-charge MOSFET connected to the other end of said source-drain path of said first MOSFET and to the other end of said source-drain path of said second MOSFET, said pre-charge MOSFET applying said second voltage to the other end of said source-drain path of said first MOSFET and to the other end of said source-drain path of said second MOSFET.

2. A dynamic RAM according to claim 1, wherein said pair of complementary bit lines coupled to at least 1,024 dynamic memory cells.

3. A dynamic RAM according to claim 1, further including:
- means for effecting a first period in which said power switch MOSFET is turned off, said pre-charge MOSFET is turned on, said first and said second switch MOSFETs are turned off, and said third and said fourth switch MOSFETs are turned on in order to pre-charge said pair of complementary bit lines with a predetermined voltage each;
- means for effecting a second period in which said power switch MOSFET is turned off, said pre-charge MOSFET is turned on, said first and said second switch MOSFET are turned on, said third and said fourth switch MOSFET are turned off, and one of said dynamic memory cells connected to one of said pair of complementary bit lines supplies a read signal to that complementary bit line; and
- means for effecting a third period in which said power switch MOSFET is turned on, said pre-charge MOSFET is turned off, said first and said second switch MOSFETs are turned on, and said third and said fourth switch MOSFETs are turned off in order to activate said first and said second MOSFETs.

4. A dynamic RAM according to claim 3, wherein said first through said fourth switch MOSFETs, and said first and said second MOSFETs are an N-channel MOSFET each in terms of conductivity, and wherein said third and said fourth MOSFETs are a P-channel MOSFET each in terms of conductivity.

5. A dynamic RAM comprising a pair of complementary bit lines, a plurality of dynamic memory cells connected to said pair of complementary bit lines, and a sense amplifier connected to said pair of complementary bit lines for detecting the potential difference between said pair of complementary bit lines;

wherein said sense amplifier includes a pair of MOSFETs connected respectively to said pair of complementary bit lines, and wherein said dynamic RAM further includes compensating means for compensating for the threshold difference between said pair of MOSFETs, wherein said sense amplifier comprises:
- a first and a second input terminal;
- a first MOSFET having a source-drain path and a gate, one end of said source-drain path being connected to one of said pair of complementary bit lines, said gate being connected to the other complementary bit line;
- a second MOSFET having a source-drain path and a gate, one end of said source-drain path being connected to said other complementary bit line, said gate being connected to said one complementary bit line;
- first capacity means having a first and a second electrode, said first electrode being connected to the other end of said source-drain path of said first MOSFET, said second electrode being fed with a predetermined voltage;
- second capacity means having a third and a fourth electrode, said third electrode being connected to the other end of said source-drain path of said second MOSFET, said fourth electrode being fed with said predetermined voltage;
- pre-charge means for applying a predetermined pre-charge voltage to said pair of complementary bit lines; and
- power switch means connected to the other ends of said source-drain paths of said first and said second MOSFET's for applying an activation voltage to said other ends of said source-drain paths.

6. A dynamic RAM according to claim 5, further comprising:
- a first switch MOSFET having a source-drain path and a gate, said source drain path being connected interposingly between said first input terminal and said one complementary bit line; and
- a second switch MOSFET having a source-drain path and a gate, said source-drain path being connected interposingly between said second input terminal and said other complementary bit line;

wherein said dynamic RAM includes:

means for effecting a first period in which said pre-charge means is activated to supply said predetermined voltage to said second electrode of said first capacity means and to said fourth electrode of said second capacity means;

means for effecting a second period in which one of the memory cells connected to said one complementary bit line applies a read signal to that line;

means for effecting a third period in which said first and said second MOSFETs are turned off and said power switch means is turned on; and means for effecting a fourth period in which said first and said second switch MOSFETs are turned on.

7. A dynamic RAM according to claim 6, further comprising a step-down circuit and an address selection circuit;

wherein said step-down circuit produces said precharge voltage using a supply voltage received from outside of a semiconductor integrated circuit device by which said dynamic RAM is formed, said pre-charge voltage being lower than said supply voltage.

8. A dynamic RAM comprising a plurality of pairs of a first and a second memory array, each pair of memory arrays including a switch MOSFET for disconnecting midway each bit line connected to a sense amplifier, said dynamic RAM being addressed so that if a word line intersecting the bit line outside said sense amplifier relative to said switch MOSFET is selected in said first memory array, the word line intersecting the bit line on the sense amplifier side relative to said switch MOSFET is selected in second memory array; and that if the word line intersecting the bit line on the sense amplifier side relative to said switch MOSFET is selected in said first memory array, the word line intersecting the bit line outside said sense amplifier relative to said switch MOSFET is selected in said second memory array; wherein said switch MOSFET is turned off for the memory array in which the word line intersecting the bit line on the sense amplifier side is selected.

9. A dynamic RAM according to claim 8, further comprising a plurality of sets of memory arrays, each set of memory arrays including a switch MOSFET for interconnecting common source lines to which said sense amplifier is connected, wherein word lines are selected consecutively in a given set of memory arrays in refresh mode, and wherein said switch MOSFET interconnecting said common source lines is turned on to start activating said sense amplifier, the power switch MOSFET of said sense amplifier being turned on for amplification after said switch MOSFET is turned off.

10. A dynamic RAM according to claim 9, wherein said common source lines of said sense amplifier are furnished with a short-circuit switch MOSFET which short-circuits said common source lines in an inactive state.

11. An information processing system utilizing as a memory a dynamic RAM comprising a plurality of pairs of a first and a second memory array, each pair of memory arrays including a switch MOSFET for disconnecting midway each bit line connected to a sense amplifier, said dynamic RAM being addressed so that if a word line intersecting the bit line outside said sense amplifier relative to said switch MOSFET is selected in said first memory array, the word line intersecting the bit line on the sense amplifier side relative to said switch MOSFET is selected in second memory array; and that if the word line intersecting the bit line on the sense amplifier side relative to said switch MOSFET is selected in said first memory array, the word line intersecting the bit line outside said sense amplifier relative to said switch MOSFET is selected in said second memory array; wherein said switch MOSFET is turned off for the memory array in which the word line intersecting the bit line on the sense amplifier side is selected.

12. An information processing system utilizing as a memory a dynamic RAM including a sense amplifier in which pairs of MOSFETs are each compensated for disparities in characteristic and in which the parasitic capacity of bit lines is at least 20 times the capacity of memory cells, said dynamic RAM comprising a plurality of sets of memory arrays, each set of memory arrays including a switch MOSFET for interconnecting common source lines to which said sense amplifier is connected, wherein word lines are selected consecutively in a given set of memory arrays in refresh mode, and wherein said switch MOSFET interconnecting said common source lines is turned on to start activating said sense amplifier, the power switch MOSFET of said sense amplifier being turned on for amplification after said switch MOSFET is turned off.

13. A dynamic RAM comprising a pair of complementary bit lines, a plurality of dynamic memory cells connected to said pair of complementary bit lines, and a sense amplifier connected to said pair of complementary bit lines for detecting the potential difference between the two complementary bit lines;

wherein said sense amplifier includes a first and a second MOSFET, said first MOSFET being connected to one of said pair of complementary bit lines and having a first threshold value, said second MOSFET being connected to the other complementary bit line and having a second threshold value;

wherein said first MOSFET amplifies the voltage on said other complementary bit line and supplies said one complementary bit line with a voltage in accordance with said first threshold value during pre-charging of said pair of complementary bit lines; and wherein said second MOSFET amplifies the voltage on said one complementary bit line and supplies said other complementary bit line with a voltage in accordance with said second threshold value during said pre-charging.

14. A dynamic RAM according to claim 1, wherein the parasitic capacity of one of said pair of complementary bit lines is substantially at least 20 times the capacity of one of said plurality of dynamic memory cells.

* * * * *